US012700459B2

(12) United States Patent
Park et al.

(10) Patent No.: US 12,700,459 B2
(45) Date of Patent: Aug. 4, 2026

(54) NON-VOLATILE MEMORY DEVICE AND ERASE METHOD THEREOF

(71) Applicant: Samsung Electronics Co., Ltd., Suwon-si (KR)

(72) Inventors: Jungmin Park, Suwon-si (KR); Minseok Kim, Suwon-si (KR); Junyong Park, Suwon-si (KR); Suyong Kim, Suwon-si (KR); Ilhan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 294 days.

(21) Appl. No.: 17/984,890

(22) Filed: Nov. 10, 2022

(65) Prior Publication Data
US 2023/0154542 A1      May 18, 2023

(30) Foreign Application Priority Data

Nov. 15, 2021    (KR) ........................ 10-2021-0157099
May 20, 2022    (KR) ........................ 10-2022-0062336

(51) Int. Cl.
*G11C 16/14* (2006.01)
*G11C 16/08* (2006.01)
*G11C 16/24* (2006.01)

(52) U.S. Cl.
CPC .............. *G11C 16/14* (2013.01); *G11C 16/08* (2013.01); *G11C 16/24* (2013.01)

(58) Field of Classification Search
CPC .......... G11C 16/14; G11C 16/08; G11C 16/24
USPC ..................................................... 365/185.29
See application file for complete search history.

(56) References Cited

U.S. PATENT DOCUMENTS

| | | | |
|---|---|---|---|
| 8,526,239 B2 | 9/2013 | Kim | |
| 8,902,658 B1 | 12/2014 | Raghu et al. | |
| 9,142,304 B2 | 9/2015 | Costa et al. | |
| 9,230,676 B1 | 1/2016 | Pang et al. | |
| 2006/0140012 A1 | 6/2006 | Wan et al. | |
| 2013/0163336 A1 | 6/2013 | Li et al. | |
| 2016/0055915 A1 | 2/2016 | Dong et al. | |
| 2019/0156896 A1* | 5/2019 | Park ...................... | G11C 16/32 |

(Continued)

FOREIGN PATENT DOCUMENTS

KR            101119371 B1      3/2012

OTHER PUBLICATIONS

Extended European Search Report (EESR) issued Mar. 17, 2023 for corresponding EP Patent Application No. 22207331.4.

*Primary Examiner* — Amir Zarabian
*Assistant Examiner* — Daniel John King
(74) *Attorney, Agent, or Firm* — Muir Patent Law, PLLC

(57) ABSTRACT

A non-volatile memory device includes a plurality of cell strings in a vertical direction, each of the plurality of cell strings including a plurality of memory cells respectively connected to a plurality of word lines, and an erase control transistor having a first end connected to at least one of both ends of plurality of memory cells and a second end connected to at least one of both ends of each of the plurality of cell strings, and a row decoder configured to apply a first bias voltage to the plurality of word lines in a first period in which an erase voltage applied to the second end of the erase control transistor increases to a target level and to apply a second bias voltage higher than the first bias voltage to at least some of the plurality of word lines in a second period after the first period.

20 Claims, 21 Drawing Sheets

(56)  References Cited

U.S. PATENT DOCUMENTS

| 2020/0143893 | A1 |   | 5/2020 | Rabkin et al. |            |
|--------------|-----|---|---------|---------------|------------|
| 2020/0411105 | A1 | * | 12/2020 | Lee           | G11C 16/14 |
| 2022/0392541 | A1 | * | 12/2022 | Lee           | G11C 16/08 |

* cited by examiner

FIG. 12

NON-VOLATILE MEMORY DEVICE AND ERASE METHOD THEREOF

CROSS-REFERENCE TO RELATED APPLICATIONS

This application is based on and claims priority under 35 U.S.C. § 119 to Korean Patent Application Nos. 10-2021-0157099, filed on Nov. 15, 2021, and 10-2022-0062336, filed on May 20, 2022, in the Korean Intellectual Property Office, the disclosure of each of which is incorporated by reference herein in its entirety.

BACKGROUND

The inventive concept relates to a non-volatile memory device, and more particularly, to an erase method of a non-volatile memory device including cell strings respectively corresponding to vertical channel structures.

A memory device is used to store data and classified into a volatile memory device and a non-volatile memory device. As the non-volatile memory device is required to have high capacity and to be miniaturized, a three-dimensional memory device including a plurality of vertical channel structures extending on a substrate in a vertical direction has been developed. In accordance with the characteristics of the plurality of vertical channel structures, an erase method of improving dispersion characteristics during an erase operation is being developed.

SUMMARY

The inventive concept relates to a non-volatile memory device capable of improving dispersion characteristics of memory cells in accordance with an erase operation and an erase method of the non-volatile memory device.

According to an aspect of the inventive concept, there is provided a non-volatile memory device including a memory cell array including a plurality of cell strings extending on a substrate in a vertical direction, each of the plurality of cell strings including a plurality of memory cells connected in series and respectively connected to a plurality of word lines, and an erase control transistor having a first end connected to at least one of both ends of plurality of memory cells and a second end connected to at least one of both ends of each of the plurality of cell strings, and a row decoder configured to apply a first bias voltage to the plurality of word lines in a first period in which an erase voltage applied to the second end of the erase control transistor increases to a target level and to apply a second bias voltage higher than the first bias voltage to at least some of the plurality of word lines in a second period after the first period, during an erase operation for the memory cell array.

According to an aspect of the inventive concept, there is provided a non-volatile memory device including a memory cell array including a plurality of cell strings extending on a substrate in a vertical direction, each of the plurality of cell strings including a plurality of memory cells connected in series and respectively connected to a plurality of word lines divided into a first word line group and a second word line group, and an erase control transistor having a first end connected to at least one of both ends of plurality of memory cells and a second end connected to at least one of both ends of each of the plurality of cell strings, and a row decoder configured to apply a first bias voltage to the plurality of word lines in a first period in which an erase voltage applied to the second end of the erase control transistor increases to a first target level and to apply a second bias voltage higher than the first bias voltage to the second word line group in a second period after the first period, during an erase operation for the memory cell array.

According to an aspect of the inventive concept, there is provided a non-volatile memory device including a memory cell array including a plurality of cell strings extending on a substrate in a vertical direction, each of the plurality of cell strings including a plurality of memory cells connected in series and respectively connected to a plurality of word lines, and an erase control transistor having a first end connected to at least one of both ends of plurality of memory cells and a second end connected to at least one of both ends of each of the plurality of cell strings, and a control logic circuit configured to control an erase operation of the memory cell array and to control driving voltages provided to the memory cell array such that a first bias voltage is applied to the plurality of word lines in an erase voltage set up period of an erase operation period and a second bias voltage higher than the first bias voltage is applied to at least some of the plurality of word lines in an erase period of the erase operation period after the erase voltage set up period.

According to an aspect of the inventive concept, there is provided an erase method of a non-volatile memory device including a plurality of cell strings stacked on a substrate in a vertical direction. The erase method includes increasing a voltage applied to one end of an erase control transistor connected to at least one of both ends of each of the plurality of cell strings to an erase voltage in a first period of an erase operation period, applying a first bias voltage to a plurality of word lines connected to the plurality of cell strings in the first period, and applying a second bias voltage higher than the first bias voltage to at least some of the plurality of word lines in a second period after the first period.

BRIEF DESCRIPTION OF THE DRAWINGS

Example embodiments will be more clearly understood from the following detailed description taken in conjunction with the accompanying drawings in which:

FIG. 12 is a cross-sectional view illustrating a memory device having a bonding vertical NAND (B-VNAND) structure according to an example embodiment.

DETAILED DESCRIPTION OF THE EMBODIMENTS

Hereinafter, example embodiments will be described in detail with reference to the accompanying drawings.

Like numeral references refer to like elements, and their repetitive descriptions are omitted.

Figure 1:
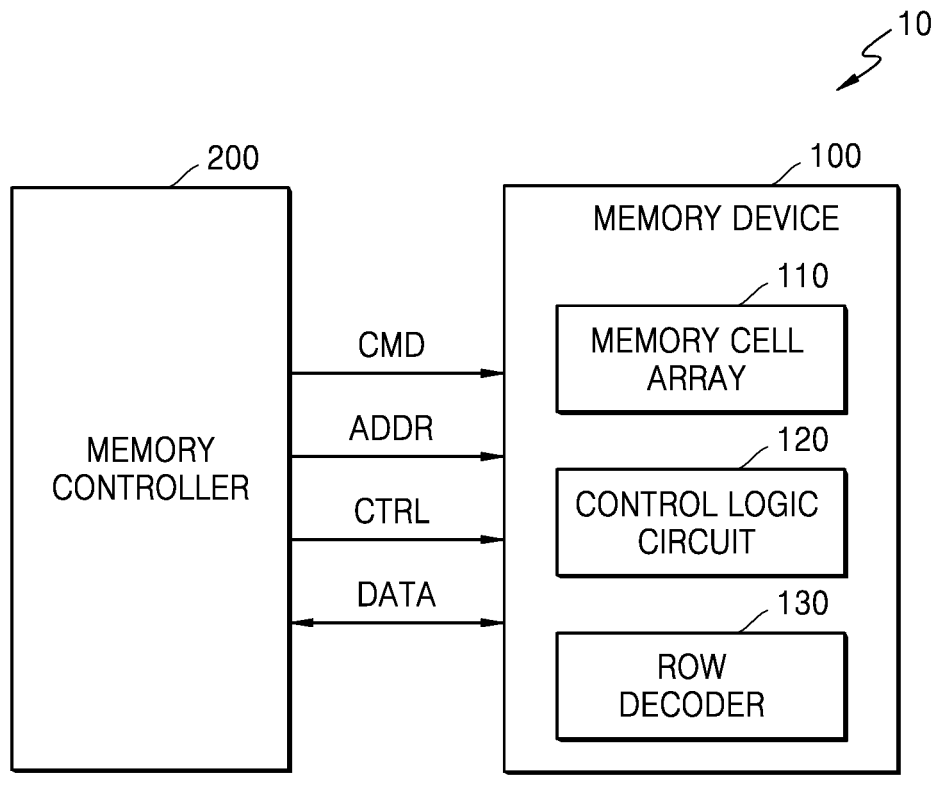
FIG. 1 is a block diagram illustrating a memory system according to an example embodiment.

FIG. 1 is a block diagram illustrating a memory system 10 according to an example embodiment.

Referring to FIG. 1, the memory system 10 may include a memory device 100 and a memory controller 200 and the memory device 100 may include a memory cell array 110, a control logic circuit 120, and a row decoder 130. The memory device 100 may include a non-volatile memory device. In the current specification, the memory device may be referred to as the non-volatile memory device.

The memory controller 200 may control the overall operation of the memory system 10. When a power is applied to the memory system 10, the memory controller 200 may execute firmware (FW). When the memory device 100 includes a NAND flash memory device, the memory controller 200 may execute FW, such as a flash translation layer (FTL), for controlling communication between an external host HOST and the memory system 10. For example, the memory controller 200 may receive data DATA and a logical block address (LBA) from the host HOST and may connect the LBA to a physical block address (PBA). The PBA may represent an address of a memory cell in which the data DATA is to be stored among memory cells included in the memory device 100.

The memory controller 200 may control the memory device 100 to read the data DATA stored in the memory device 100, in response to a read/write request from the host HOST, or to program the data DATA in the memory device 100. Specifically, the memory controller 200 may control program, read, and erase operations performed on the memory device 100 by providing an address ADDR, a command CMD, and a control signal CTRL to the memory device 100. In addition, the data DATA to be programmed and the read data DATA may be transmitted and received between the memory controller 200 and the memory device 100.

The memory cell array 110 may include a plurality of memory cells. For example, the plurality of memory cells may respectively include flash memory cells. Hereinafter, example embodiments of the inventive concept will be described in detail taking a case in which the plurality of memory cells respectively include NAND flash memory cells as an example. However, the inventive concept is not limited thereto. In some embodiments, the plurality of memory cells may include resistive memory cells, such as resistive random access memory (ReRAM), phase change RAM (PRAM), or magnetic RAM (MRAM).

The control logic circuit 120 may receive a command CMD, an address ADDR, and a control signal CTRL from the memory controller 200 and may control the overall operation of the memory device 200, based on the received command CMD, address ADDR, and control signal CTRL.

The row decoder 130 may apply voltages depending on an operation mode to signal lines respectively connected to the plurality of memory cells of the memory cell array 110, for example, a plurality of word lines, string selection lines, ground selection lines, and erase control lines, and a common source line under control by the control logic circuit 120.

In an embodiment, the memory device 100 may perform an erase operation by a gate induced drain leakage (GIDL) method and the control logic circuit 120 may control the row decoder 130 to output an erase voltage, an erase control voltage, and a bias voltage by the GIDL method. The row decoder 130 may apply a first bias voltage to the plurality of word lines in a first period in which the erase voltage is set up and may apply a second bias voltage to at least some of the plurality of word lines in a second period in which data in the plurality of memory cells is erased, wherein the second bias voltage is higher than the first bias voltage.

As channel potential increases in connection with the voltage increase of at least some word lines, a difference in channel potential among a plurality of strings provided in the memory cell array 110 may be reduced. Accordingly, dispersion characteristics (hereinafter, referred to as erase dispersion characteristics) of the plurality of memory cells in accordance with the erase operation may improve.

In an embodiment, the memory system 10 may include an internal memory mounted in an electronic device. The memory system 10 may include, for example, a solid state drive (SSD), a memory card, a micro secure digital (SD) card, or an embedded multimedia card (eMMC). In an embodiment, the memory system 10 may include an external memory detachable from the electronic device. For example, the control logic circuit 120 may include a universal flash storage (UFS) memory card, a compact flash (CF) card, an SD, a micro-SD, a mini-SD, an extreme digital (xD) card, or a memory stick.

Figure 2:
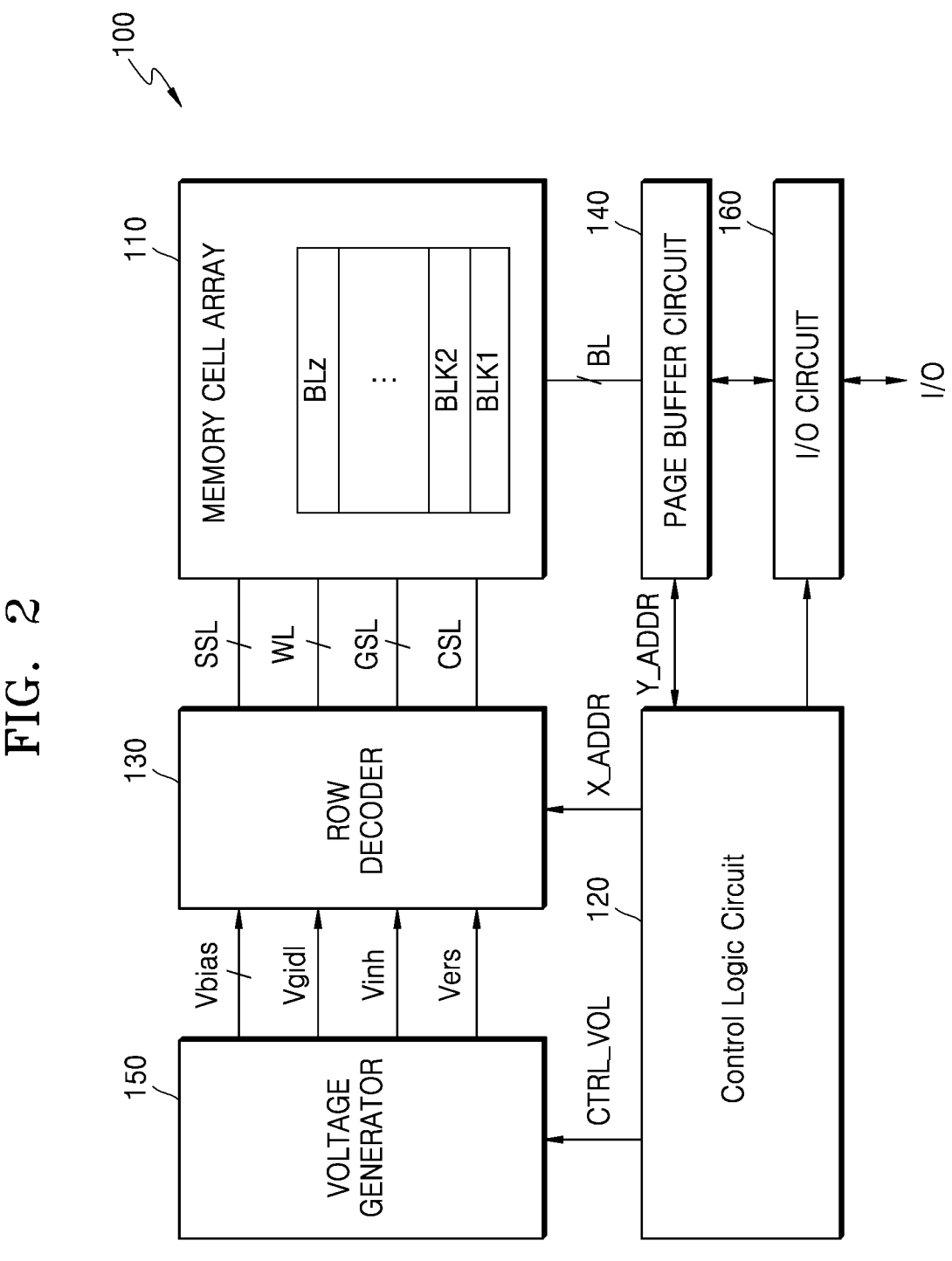
FIG. 2 is a block diagram illustrating a memory device according to an example embodiment.

FIG. 2 is a block diagram illustrating a memory device 100 according to an example embodiment.

Referring to FIG. 2, the memory device 100 may include a memory cell array 110, a control logic circuit 120, a row decoder 130, a page buffer circuit 140, a voltage generator 150, and an input/output circuit 160.

The memory cell array 110 may include a plurality of memory blocks BLK1 to BLKz, where z is a positive integer. Each of the plurality of memory blocks BLK1 to BLKz may include a plurality of pages, and each of the plurality of pages may include a plurality of memory cells. For example, a memory block may be a unit of erase and a page may be a unit of write and read. Each memory cell may store one or more bits. Specifically, each memory cell may be used as a single level cell (SLC), a multi-level cell (MLC), a triple level cell (TLC), or a quadruple level cell (QLC).

The memory cell array 110 may be connected to a plurality of word lines WL, a plurality of string selection lines SSL, a plurality of ground selection lines GSL, and a plurality of bit lines BL. The memory cell array 110 may be connected to the row decoder 130 through the plurality of word lines WL, the plurality of string selection lines SSL, the plurality of ground selection lines GSL, and a common source line CSL and may be connected to the page buffer circuit 140 through the plurality of bit lines BL. In some embodiments, the memory cell array 110 may be further connected to erase control lines (for example, GIDL_SS1 to GIDL_SS3 and/or GIDL_GS1 to GIDL_GS3 of FIG. 3A).

In an embodiment, the memory cell array 110 may include a three-dimensional memory cell array. The three-dimensional memory cell array may be monolithically formed in an active region arranged on a silicon substrate at least one physical level of the memory cell array including circuits formed on or in the substrate as circuits related to operations of the memory cells. The term "monolithic" may mean that layers at each level constituting the memory cell array are stacked immediately on layers at each lower level in the memory cell array. The three-dimensional memory cell array may include a plurality of cell strings or NAND strings arranged in a vertical direction VD. Each of the plurality of cell strings may include a plurality of memory cells respectively connected to the plurality of word lines perpendicularly stacked on a substrate. U.S. Pat. Nos. 7,679,133 B2, 8,553,466 B2, 8,654,587 B2, 8,559,235 B2, and US Patent Application Publication No. 2011/0233648 A1, the disclosures of which are incorporated by reference herein in their entireties.

The control logic circuit 120 may output various control signals for writing data in the memory cell array 110, reading data from the memory cell array 110, or erasing data from the memory cell array 110, based on the command CMD, the address ADDR, and the control signal CTRL received from the memory controller 200. As a result, the control logic circuit 120 may control all operations in the memory device 100. Specifically, the control logic circuit 120 may provide a voltage control signal CTRL_VOL to the voltage generator 150, may provide a row address X_ADDR to the row decoder 130, and may provide a column address Y_ADDR to the page buffer circuit 140. However, the inventive concept is not limited thereto, and the control logic circuit 120 may further provide other control signals to the voltage generator 150, the row decoder 130, and the page buffer circuit 140.

In an embodiment, the control logic circuit 120 may perform control so that voltages of at least some of the plurality of word lines increase after an erase voltage is set up during the erase operation. For example, the control logic circuit 120 may increase an erase voltage Vers applied to at least one of a plurality of bit lines BL and a common source line CSL connected to an erase control transistor to a target level corresponding to the erase voltage Vers (for example, 18 V) in an erase voltage set up period. The control logic circuit 120 may also increase an erase control voltage applied to an erase control line connected to a gate of the erase control transistor to a corresponding target level in the erase voltage set up period. At this time, the control logic circuit 120 may apply the first bias voltage to the plurality of word lines. For example, the first bias voltage may include a ground voltage or may have a voltage level close to that of the ground voltage.

The control logic circuit 120 may apply the second bias voltage to at least some of the plurality of word lines after a predetermined delay time from one point in time, for example, a point in time, at which the erase voltage Vers is set to have the corresponding target level, in an erase period after the erase voltage set up period, and the second bias voltage may be higher than the first bias voltage. As a result, channel potentials of the plurality of cell strings increase in connection with an increase in word line voltages and a difference in channel potentials among the plurality of cell strings are reduced so that the erase dispersion characteristics of the memory cell array 110 may improve.

The control logic circuit 120 may perform control so that an erase inhibit voltage Vinh is applied to the plurality of word lines in an erase inhibit period after the erase period and that points in time at which the erase inhibit voltage Vinh is applied to the plurality of word lines vary, wherein the erase inhibit voltage Vinh is higher than or the same as the second bias voltage. As a result, it may be possible to prevent data of memory cells connected to a word line in which data is erased at a high speed from being over-erased.

The row decoder 130 may respectively apply driving voltages depending on the operation mode to a plurality of signal lines of the memory cell array 110, for example, the plurality of word lines WL, the plurality of string selection lines SSL, the plurality of ground selection lines GSL, and the common source line CSL under control by the control logic circuit 120.

The row decoder 130 may select one of the plurality of word lines WL and one of the plurality of string selection lines SSL, in response to the row address X_ADDR. For example, during a program operation, the row decoder 130 may apply a program voltage to a selected word line in a program execution period and may apply a program verification voltage to a selected word line in a program verification period. For example, during a read operation, the row decoder 130 may apply a read voltage to the selected word line.

During the erase operation, the row decoder 130 may apply the erase voltage to a signal line (for example, at least one of the bit lines and the common source line) connected to one end of the erase control transistor, may apply the erase control voltage to the erase control line connected to the gate of the erase control transistor, and may apply the bias voltage to the plurality of word lines. The erase voltage and the erase control voltage may increase to target levels, for example, an erase target level and a control target level, in the erase voltage set up period and then, may maintain the target levels, respectively. Bias voltages applied to at least some of the plurality of word lines among the bias voltages respectively applied to the plurality of word lines may increase after the erase voltage set up period.

For example, the row decoder 130 may receive the erase voltage Vers, the erase control voltage Vgidl, the erase inhibit voltage Vinh, and a plurality of bias voltages Vbias, may provide the erase voltage Vers and the erase control voltage Vgidl to signal lines corresponding to the erase voltage Vers and the erase control voltage Vgidl, and may provide the plurality of bias voltages Vbias and the erase inhibit voltage Vinh to the plurality of word lines. The row decoder 130 may apply the first bias voltage to the plurality of word lines in the erase voltage set up period, may apply the second bias voltage to the plurality of word lines in the erase period, and may apply the erase inhibit voltage Vinh to the plurality of word lines in the erase inhibit period.

The page buffer circuit 140 may select at least one of the plurality of bit lines BL in response to the column address Y_ADDR. The page buffer circuit 140 may operate as a write driver or a sense amplifier depending on the operation mode. The page buffer circuit 140 may include a plurality of page buffers, and the plurality of page buffers may be respectively connected to the plurality of bit lines BL. In an embodiment, the page buffer circuit 140 may apply the erase voltage Vers to the erase control transistor through the plurality of bit lines BL in the erase period.

The voltage generator 150 may generate various kinds of voltages for performing the program, read, and erase operations based on the voltage control signal CTRL_VOL. During the erase operation, the voltage generator 150 may generate the erase voltage Vers, the erase control voltage Vgidl, the erase inhibit voltage Vinh, and the plurality of bias voltages Vbias and may provide the erase voltage Vers, the erase control voltage Vgidl, the erase inhibit voltage Vinh, and the plurality of bias voltages Vbias to the row decoder 130. In an embodiment, the voltage generator 150 may provide the erase voltage Vers to the page buffer circuit 140. In an embodiment, the voltage generator 150 may increase the erase voltage Vers and the erase control voltage Vgidl to the corresponding target levels with predetermined slopes in the erase voltage set up period.

The input/output circuit 160 may temporarily store the command CMD, the address ADDR, and the data DATA provided through an input/output line I/O from the outside of the memory device 100. The input/output circuit 160 may temporarily store read data of the memory device 100 and may output the read data to the outside through the input/output line I/O at a specified time.

Figure 3A:
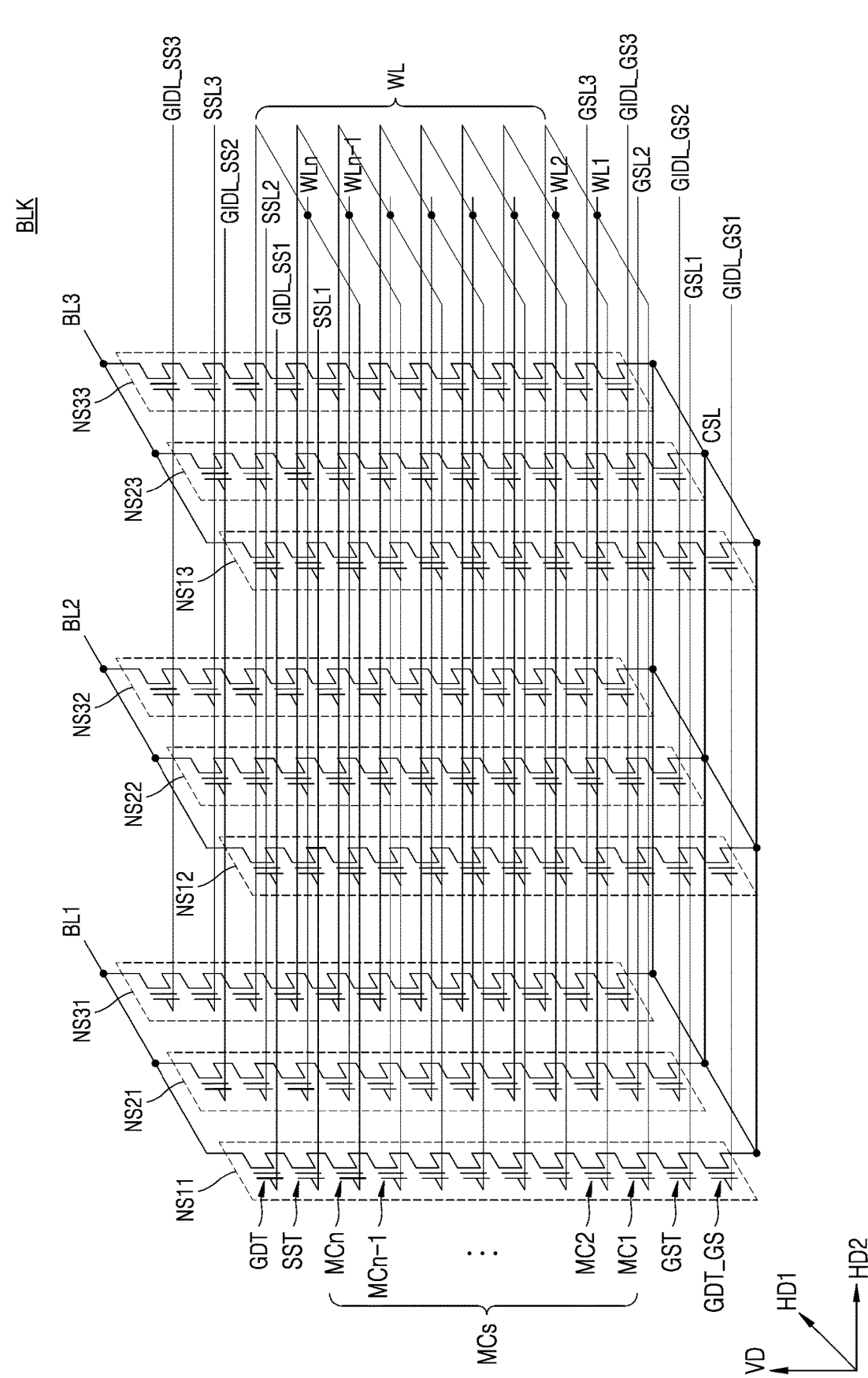
FIGS. 3A, 3B, and 3C are circuit diagrams illustrating memory blocks according to example embodiments of the inventive concept.
Figure 3B:
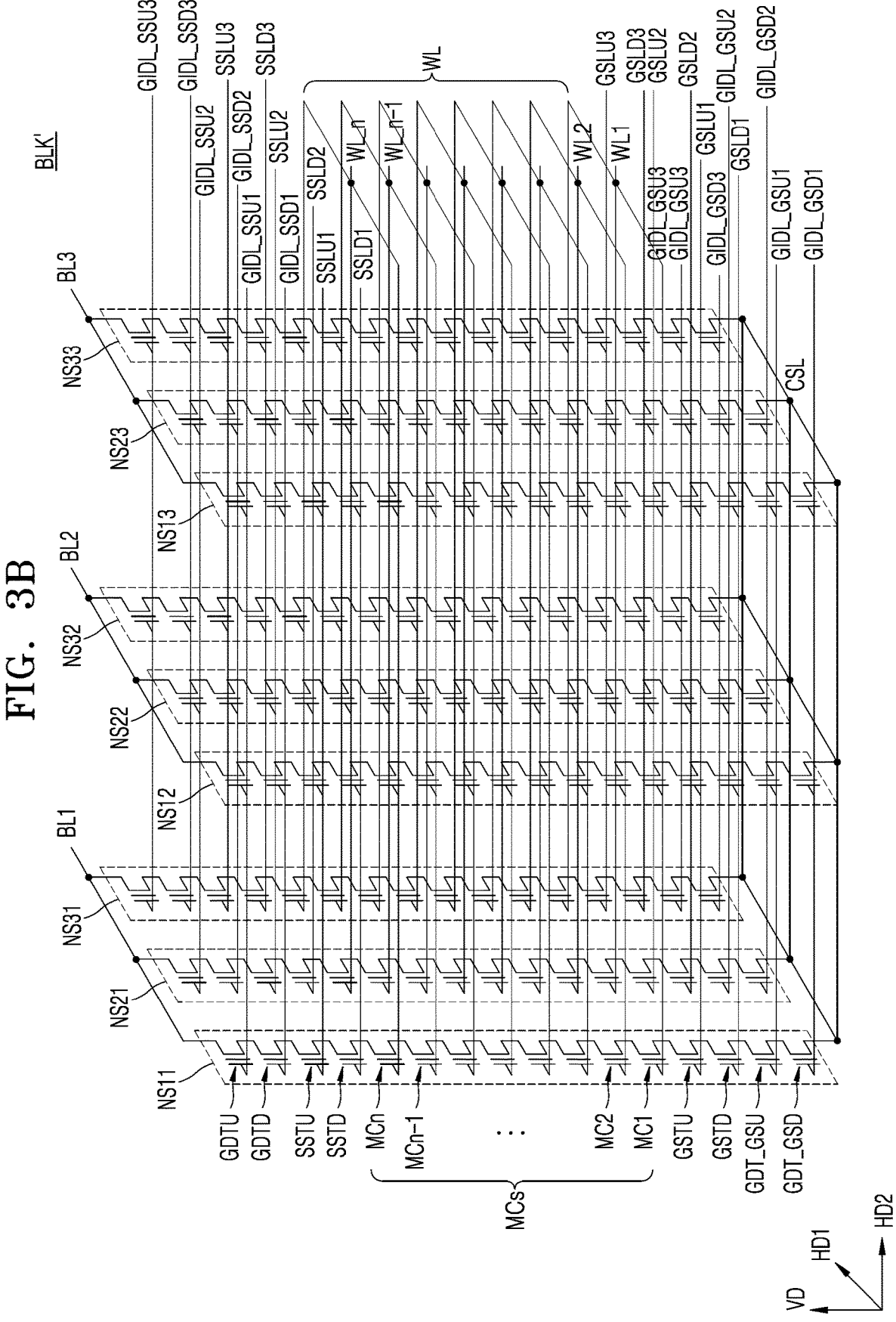
Figure 3C:
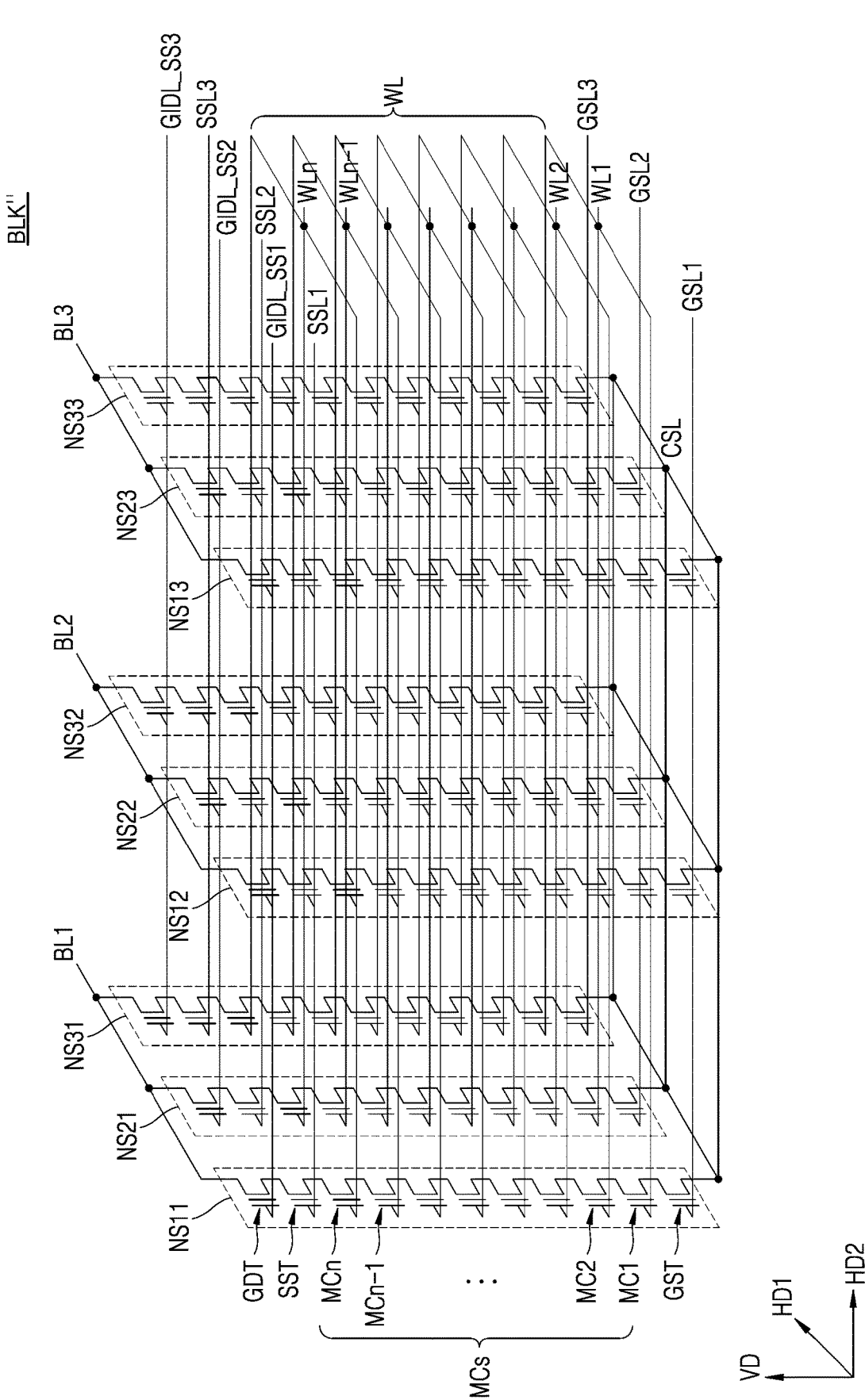

FIGS. 3A, 3B, and 3C are circuit diagrams respectively illustrating memory blocks BLK, BLK', and BLK" according to example embodiments of the inventive concept.

Referring to FIG. 3A, the memory block BLK may correspond to one of the plurality of memory blocks BLK1 to BLKz of FIG. 2. The memory block BLK may include NAND strings or cell strings NS11, NS21, NS31, NS12, NS22, NS32, NS13, NS23, and NS33 that may be connected to bit lines BL1 to BL3, erase control lines GIDL_SS1 to GIDL_SS3, string selection lines SSL1 to SSL3, word lines WL1 to WLn, ground selection lines GSL1 to GSL3, and erase control lines GIDL_GS1 to GIDL_GS3 and extend in a vertical direction VD, respectively. Here, the number of cell strings, the number of word lines, the number of bit lines, the number of ground selection lines, the number of string selection lines, and the number of erase control lines may vary in accordance with an embodiment.

The bit lines BL1 to BL3 may extend in a first direction or a first horizontal direction HD1, the word lines WL1 to WLn may extend in a second direction or a second horizontal direction HD2, and n is a positive integer. The cell strings NS11, NS21, and NS31 may be between the first bit line BL1 and the common source line CSL, the cell strings NS12, NS22, and NS32 may be between the second bit line BL2 and the common source line CSL, and the cell strings NS13, NS23, and NS33 may be between the third bit line BL3 and the common source line CSL.

For example, the cell string NS11 may include an erase control transistor GDT, a string selection transistor SST, a plurality of memory cells MCs (e.g, MC1, MC2 . . . , MCn-1, and MCn, n is being a natural number greater than 2), a ground selection transistor GST, and an erase control transistor GDT_GS that are serially connected to one another. The erase control transistor GDT may be connected to the first bit line BL1 and the first erase control line GIDL_SS1. The erase control transistor GDT may be connected between the first bit line BL1 and the string selection transistor SST. The string selection transistor SST may be connected to a string selection line SSL1, and the memory cells MCs may be respectively connected to the word lines WL1 to WLn.

The ground selection transistor GST may be connected to a ground selection line GSL1. The erase control transistor GDT_GS may be connected to the erase control line GIDL_GS1 and the common source line CSL. The erase control transistor GDT_GS may be connected between the ground selection transistor GST and the common source line CSL. Herein, for convenience of description, the terms of the erase control lines GIDL_GS1 to GIDL_GS3 and ground erase control lines GIDL_GS1 to GIDL_GS3, and the terms of the erase control transistor GDT_GS and a ground erase control transistor GDT_GS may be used interchangeably.

As the number of word lines WL1 to WLn increases, the length of each of the cell strings may increase. Accordingly, during a program operation performed on the lowermost word line farthest from the bit lines BL1 to BL3, channel recovery may deteriorate so that a bit line voltage is not smoothly transmitted to a channel region. In addition, as the erase control lines GIDL_SS1 to GIDL_SS3 are included, the erase control lines GIDL_SS1 to GIDL_SS3 operate as resistance components so that the channel recovery may deteriorate more.

Referring to FIG. 3B, the memory block BLK' may correspond to one of the plurality of memory blocks BLK1 to BLKz of FIG. 2. The memory block BLK' corresponds to a variation of the memory block BLK of FIG. 3A. Hereinafter, a difference between the memory block BLK of FIG. 3A and the memory block BLK' of FIG. 3B is mainly described. The memory block BLK' may include cell strings NS11, NS21, NS31, NS12, NS22, NS32, NS13, NS23, and NS33 that may be connected to bit lines BL1 to BL3, upper erase control lines GIDL_SSU1 to GIDL_SSU3, lower erase control lines GIDL_SSD1 to GIDL_SSD3, upper string selection lines SSLU1 to SSLU3, lower string selection lines SSLD1 to SSLD3, word lines WL, upper ground selection lines GSLU1 to GSLU3, lower ground selection lines GSLD1 to GSLD3, upper ground erase control lines GIDL_GSU1 to GIDL_GSU3, and lower ground erase control lines GIDL_GSD1 to GIDL_GSD3 and extend in the vertical direction VD, respectively.

For example, the cell string NS11 may include an upper erase control transistor GDTU, a lower erase control transistor GDTD, an upper string selection transistor SSTU, a lower string selection transistor SSTD, a plurality of memory cells MCs (e.g., MC1, MC2, . . . MCn-1, and MCn, n is being a natural number greater than 2), an upper ground selection transistor GSTU, a lower ground selection transistor GSTD, an upper ground erase control transistor GDT_GSU, and a lower ground erase control transistor GDT_GSD. The upper erase control transistor GDTU may be connected to the bit line BL1 and the erase control line GIDL_SSU1, and the lower erase control transistor GDTD may be connected to the erase control line GIDL_SSD1.

The upper string selection transistor SSTU may be connected to the upper string selection line SSLU1, and the lower string selection transistor SSTD may be connected to the lower string selection line SSLD1. The upper ground selection transistor GSTU may be connected to the upper ground selection line GSLU1, and the lower ground selection transistor GSTD may be connected to the lower ground selection line GSLD1. The upper ground erase control transistor GDT_GSU may be connected to the upper erase control line GIDL_GSU1, and the lower ground erase control transistor GDT_GSD may be connected to the lower erase control line GIDL_GSD1 and the common source line CSL.

Referring to FIG. 3C, the memory block BLK" may correspond to one of the plurality of memory blocks BLK1 to BLKz of FIG. 2. The memory block BLK" corresponds to a variation of the memory block BLK of FIG. 3A. Hereinafter, a difference between the memory block BLK of FIG. 3A and the memory block BLK" of FIG. 3C is mainly described.

The memory block BLK" may include cell strings NS11, NS21, NS31, NS12, NS22, NS32, NS13, NS23, and NS33 that may be connected to bit lines BL1 to BL3, erase control lines GIDL_SS1 to GIDL_SS3, string selection lines SSL1 to SSL3, word lines WL1 to WLn, and ground selection lines GSL1 to GSL3 and extend in the vertical direction VD, respectively. Compared to the memory block BLK of FIG. 3A, the memory block BLK" may not include the ground erase control line GIDL_GS and each of the cell strings NS11, NS21, NS31, NS12, NS22, NS32, NS13, NS23, and NS33 may not include the ground erase control transistor GDT_GS.

Figure 4A:
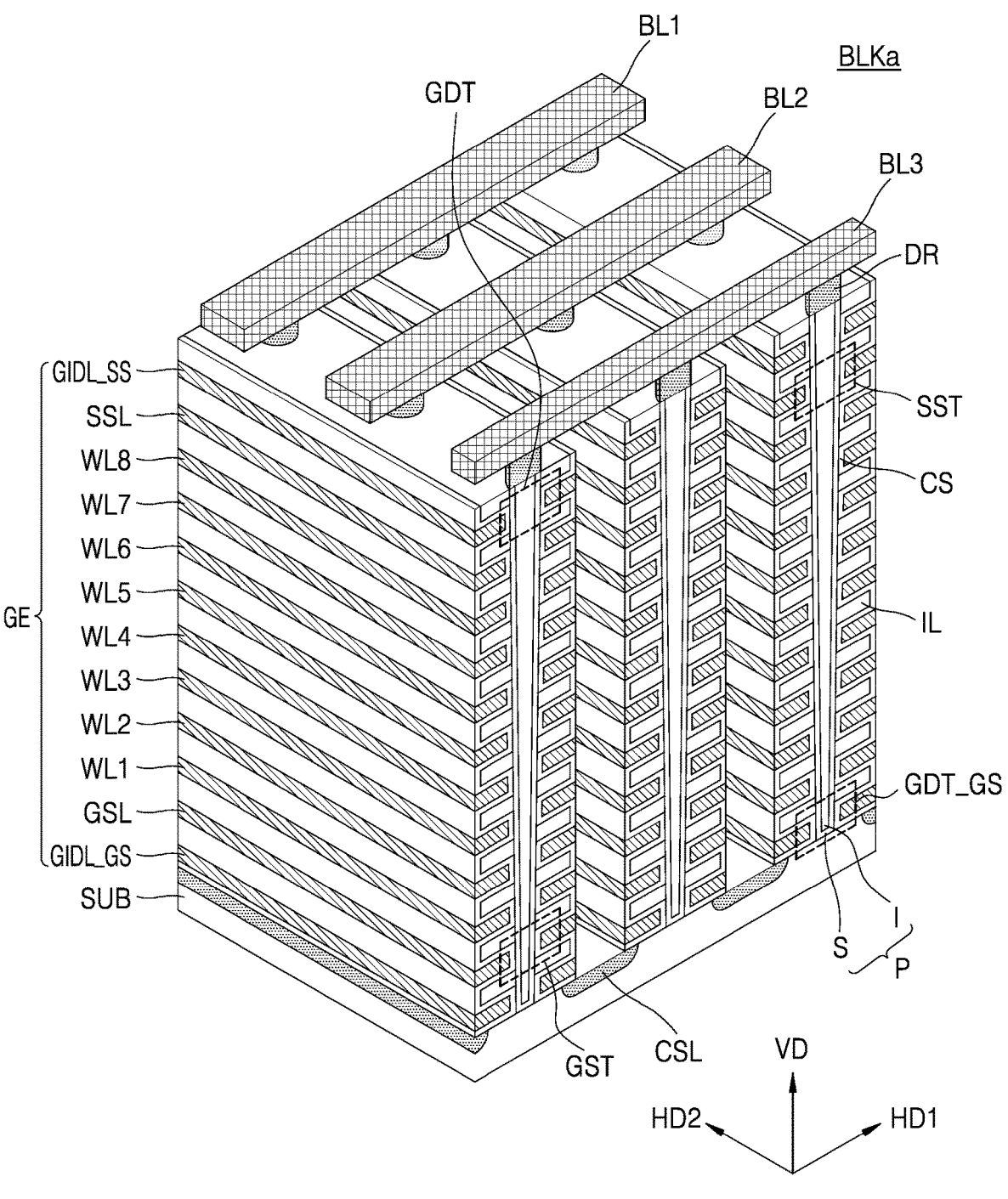
FIGS. 4A and 4B are perspective views illustrating memory blocks according to example embodiments of the inventive concept.
Figure 4B:
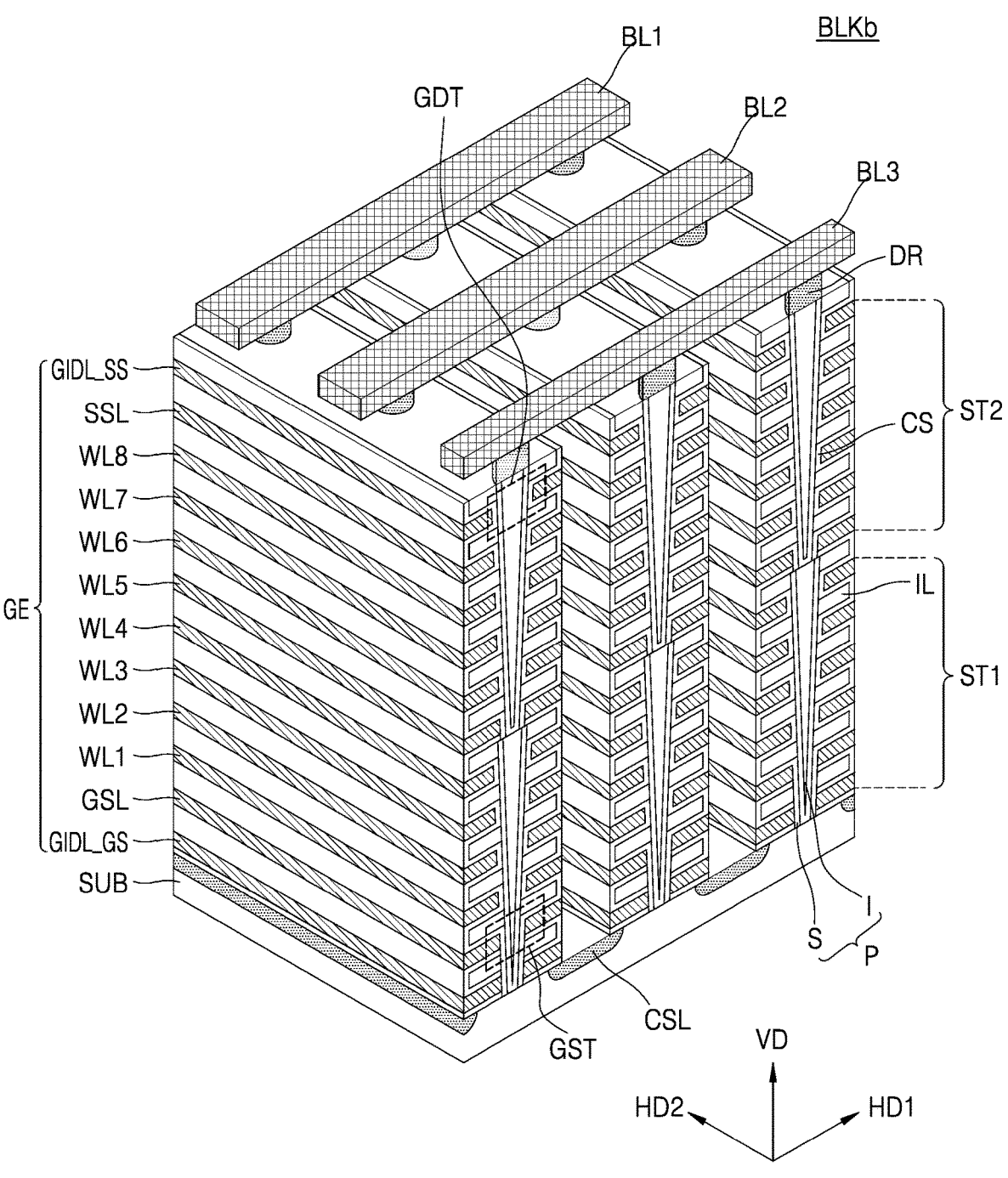

FIGS. 4A and 4B are perspective views respectively illustrating memory blocks BLKa and BLKb according to example embodiments of the inventive concept.

Referring to FIG. 4A, the memory block BLKa may correspond to one of the plurality of memory blocks BLK1 to BLKz of FIG. 2. The memory block BLKa is formed perpendicular to a substrate SUB. The substrate SUB has a first conductive type (for example, p type) and extends on the substrate SUB in a second horizontal direction HD2. In an embodiment, a common source line CSL doped with a second conductive type (for example, n type) impurities may be provided to the substrate SUB. In an embodiment, the substrate SUB may include polysilicon and the flat-plate common source line CSL may be arranged on the substrate SUB. On the substrate SUB, a plurality of insulating layers IL extending in the second horizontal direction HD2 are sequentially provided in the vertical direction VD and are apart from one another in the vertical direction VD. For example, the plurality of insulating layers IL may include an insulating material, such as silicon oxide.

On the substrate SUB, a plurality of pillars P sequentially arranged in the first horizontal direction HD1 and passing through the plurality of insulating layers IL in the vertical direction VD are provided. For example, the plurality of pillars P pass through the plurality of insulating layers IL and contact the substrate SUB. Specifically, a surface layer S of each of the plurality of pillars P may include a silicon material having a first type and may function as a channel region. Accordingly, in some embodiments, each of the plurality of pillars P may be referred to as a channel structure or a vertical channel structure. On the other hand, an internal layer I of each of the plurality of pillars P may include an insulating material, such as silicon oxide or an air gap.

A charge storage layer CS is provided along exposed surfaces of the plurality of insulating layers IL, the plurality of pillars P, and the substrate SUB. The charge storage layer CS may include a gate insulating layer (or referred to as a 'tunneling insulating layer'), a charge trap layer, and a blocking insulating layer. For example, the charge storage layer CS may have an oxide-nitride-oxide (ONO) structure. In addition, on the exposed surface of the charge storage layer CS, gate electrodes GE, such as ground erase control lines GIDL_GS, ground selection lines GSL, word lines WL1, WL2, WL3, WL4 WL5, WL6, WLZ, and WL8, string selection lines SSL, and erase control lines GIDL_SS, are provided. The gate electrodes GE and the insulation layers IL are alternately stacked on the substrate SUB. The numbers of ground erase control lines GIDL_GS, ground selection lines GSL, word lines WL1, WL2, WL3, WL4, WL5, WL6, WLZ, and WL8, string selection lines SSL, and erase control lines GIDL_SS may vary according to example embodiments.

On the plurality of pillars P, drain contacts or drains DR are respectively provided. For example, the drains DR may include a silicon material doped with second conductive type impurities. On the drains DR, the bit lines BL1 to BL3 extending in the first horizontal direction HD1 and apart from one another by a certain distance in the second horizontal direction HD2 are provided.

Referring to FIG. 4B, the memory block BLKb may correspond to one of the plurality of memory blocks BLK1 to BLKz of FIG. 2. In addition, the memory block BLKb corresponds to a variation of the memory block BLKa of FIG. 4A descriptions given above with reference to FIG. 4A may be applied to the current embodiment. The memory block BLKb is formed perpendicular to a substrate SUB. The memory block BLKb may include a plurality of memory stacks ST. One of the memory stacks ST may include a first memory stack ST1 and a second memory stack ST2 stacked in the vertical direction VD. Herein, the plurality of memory stacks ST may correspond to the plurality of pillars P or a plurality of channels. Referring to FIG. 4B, one of the memory stacks ST of the memory block BLKb may include a first memory stack ST1 and a second memory stack ST2. The first memory stack ST1 may be positioned between the second memory stack ST2 and the substrate SUB. For example, the first memory stack ST1 may be formed through an etching process and a polysilicon deposition process before the second memory stack ST2 is formed. After the first memory stack ST1 is formed, the second memory stack ST2 may be formed on the first memory stack ST1 through an additional etching process and the polysilicon deposition process. In this case, the memory cells corresponding to the first memory stack ST1 may be defined as a first memory group, and the memory cells corresponding to the second memory stack ST2 may be defined as a second memory group.

Widths of the first memory stack ST1 and the second memory stack ST2 may have the same profile. For example, a diameter of the first memory stack ST1 at a point, at which the first memory stack ST1 contacts the second memory stack ST2, may be greater than a diameter of the second memory stack ST2. However, the inventive concept is not limited thereto, and the memory block BLKb may include three or more memory stacks.

Figure 5A:
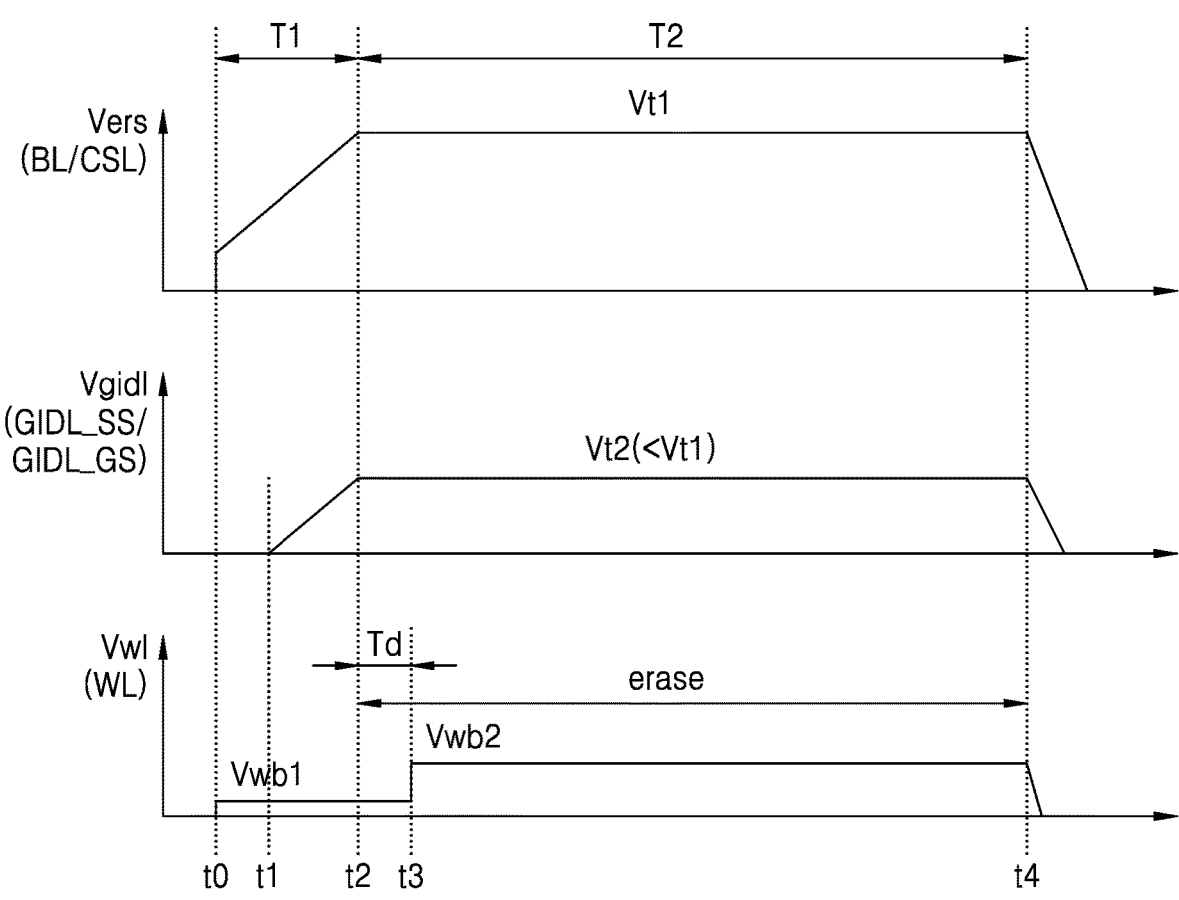
FIGS. 5A and 5B are timing diagrams illustrating erase operations according to example embodiments of the inventive concept.
Figure 5B:
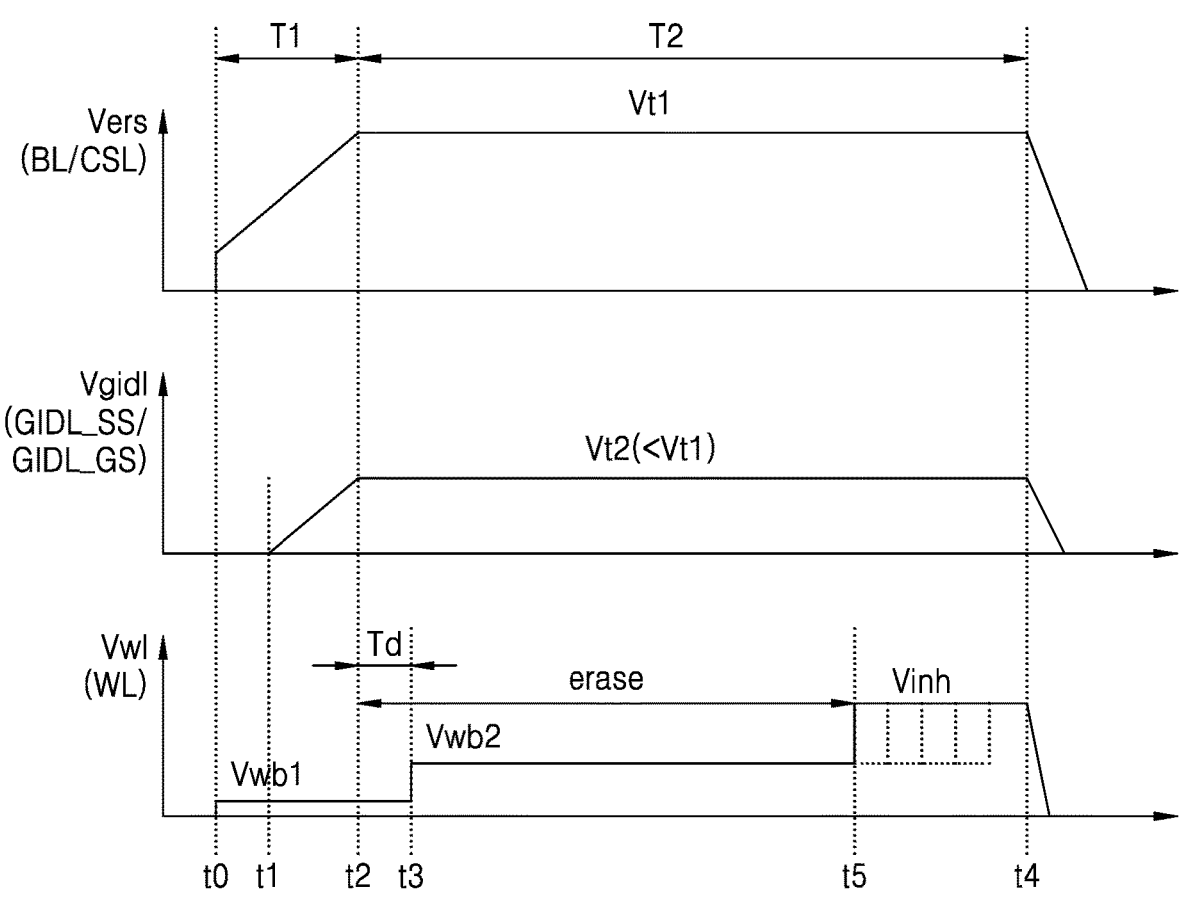

FIGS. 5A and 5B are timing diagrams illustrating erase operations according to example embodiments of the inventive concept. The erase operation according to the timing diagrams of FIGS. 5A and 5B may be performed by the memory device 100 of FIG. 1.

Referring to FIG. 5A, the memory device 100 may perform the erase operation by a GIDL erase method. The GIDL erase method may include a unidirectional GIDL erase method of charging channels of the cell strings NS11, NS21, NS31, NS12, NS22, NS32, NS13, NS23, and NS33 through bottoms or tops of the cell strings NS11, NS21, NS31, NS12, NS22, NS32, NS13, NS23, and NS33 and a bi-directional GIDL erase method of charging channels of the cell strings NS11, NS21, NS31, NS12, NS22, NS32, NS13, NS23, and NS33 in both directions of the cell strings NS11, NS21, NS31, NS12, NS22, NS32, NS13, NS23, and NS33.

In the bi-directional GIDL erase method of charging the channels of the cell strings NS11, NS21, NS31, NS12, NS22, NS32, NS13, NS23, and NS33 in the both directions of the cell strings NS11, NS21, NS31, NS12, NS22, NS32, NS13, NS23, and NS33, the erase voltage Vers may be applied to the bit lines (for example, BL1, BL2, and BL3 of FIG. 3A) and the common source line (for example, CSL of FIG. 3A) and the erase control voltage Vgidl may be applied to gates of the erase control transistors (for example, GDT_GS and GDT of FIG. 3A) at both ends of each of the cell strings NS11, NS21, NS31, NS12, NS22, NS32, NS13, NS23, and NS33 and respectively connected to the bit lines and the common source line. In other words, the erase control voltage Vgidl may be applied to the gates of the erase control transistors (for example, GDT_GS and GDT of FIG. 3A) through the erase control lines GIDL_SS and GIDL_GS (for example, GIDL_SS1 to GIDL_SS3 and GIDL_GS1 to GIDL_GS3 of FIG. 3A). A target level Vt2 (hereinafter, referred to as a control target level) of the erase control voltage Vgidl is lower than a target level Vt1 (hereinafter, referred to as an erase target level) of the erase voltage Vers. As a result, GIDL may occur in the erase control transistors at both ends of each of the cell strings NS11, NS21, NS31, NS12, NS22, NS32, NS13, NS23, and NS33 and holes generated in the GIDL may be injected into the channels of the cell strings so that potentials of the channels of the cell strings may increase to the potential of the erase voltage Vers.

In an upper GIDL erase method of charging the channels of the cell strings NS11, NS21, NS31, NS12, NS22, NS32, NS13, NS23, and NS33 in one direction, the erase voltage Vers may be applied to the bit lines BL (for example, BL1, BL2, and BL3 of FIG. 3) and the erase control voltage Vgidl may be applied to the gates of the erase control transistors (for example, GDT of FIG. 3A) connected to the bit lines. The channels of the cell strings NS11, NS21, NS31, NS12, NS22, NS32, NS13, NS23, and NS33 may be charged from the tops of the cell strings NS11, NS21, NS31, NS12, NS22, NS32, NS13, NS23, and NS33. At this time, the common source line CSL and the ground erase control transistor (for example, GDT_GS of FIG. 3A) to which the common source line CSL is connected may float.

In a lower GIDL erase method, the erase voltage Vers may be applied to the common source line CSL and the erase control voltage Vgidl may be applied to the gate of the ground erase control transistor (for example, GDT_GS of FIG. 3) connected to the common source line CSL. The channels of the cell strings NS11, NS21, NS31, NS12, NS22, NS32, NS13, NS23, and NS33 may be charged from the bottoms of the cell strings NS11, NS21, NS31, NS12, NS22, NS32, NS13, NS23, and NS33. At this time, the bit lines and the erase control transistor (for example, GDT of FIG. 3A) to which the bit lines are connected may float.

Hereinafter, description is given assuming that the bi-directional GIDL method is used as the erase method according to the inventive concept. However, the inventive concept is not limited thereto, and either the lower GIDL erase method or the upper GIDL erase method may be used as the erase method according to the inventive concept.

The memory device 100 may apply the erase voltage Vers to the bit line BL and the common source line CSL and may set the erase voltage Vers to be at the erase target level Vt1 in a first period T1. For example, the memory device 100 may increase the erase voltage Vers with a predetermined slope from a first point in time t0 to a third point in time t2 and the erase voltage Vers may reach the erase target level Vt1 at the third point in time t2. The first period T1 may be referred to as a set up period.

The memory device 100 may apply the erase control voltage Vgidl to the erase control lines GIDL_SS and GIDL_GS and may set the erase control voltage Vgidl to be at the control target level Vt2 in the first period T1. For example, the memory device 100 may increase the erase control voltage Vgidl with a predetermined slope from a second point in time t1 to the third point in time t2 and the erase control voltage Vgidl may reach the control target level Vt2 at the third point in time t2.

The memory device 100 may apply the bias voltage to the word lines WL and may apply a first bias voltage Vwb1 to the word lines WL in the first period T1. A voltage of the word lines WL, that is, a word line voltage Vw1, may increase to the first bias voltage Vwb1. In an embodiment, the first bias voltage Vwb1 may be close to a ground voltage (for example, 0 V) or may be the ground voltage.

In a second period T2 after the first period T1, the erase voltage Vers and the erase control voltage Vgidl may maintain the erase target level Vt1 and the control target level Vt2, respectively.

The memory device 100 may apply a second bias voltage Vwb2 to the word lines WL in the second period T2. The second bias voltage Vwb2 may be higher than the first bias voltage Vwb1. The memory device 100 may apply the second bias voltage Vwb2 to the word lines WL at a fourth point in time t3 after a predetermined delay time Td from the third point in time t2. As the voltages of the respective lines are maintained as illustrated in FIG. 5A in the second period T2, data in the plurality of memory cells respectively connected to the word lines WL may be erased. The second period T2 may be referred to as an erase period. At a fifth point in time t4, the erase operation (one shot erase) may be completed. Then, the memory device 100 may perform erase verification and may perform the erase operation again on memory cells of which data in the plurality of memory cells is not erased.

Referring to FIG. 5B, the memory device 100 may perform the erase operation based on the GIDL erase method. Because the operation of the non-volatile memory device is similar to that of FIG. 5A, previously given description is not given again and a difference from the erase operation of FIG. 5A is described.

The memory device 100 may apply the erase inhibit voltage Vinh to the word lines WL at an end portion of the second period T2 (e.g., a certain point in time between a sixth point in time t5 and the fifth point in time t4). Points in time at which the erase inhibit voltage Vinh is applied to the word lines WL may vary. For example, a point in time at which the erase inhibit voltage Vinh is applied to a word line in which data is erased at a higher speed may be earlier than a point in time at which the erase inhibit voltage Vinh is applied to a word line in which data is erased at a lower speed. As a result, it may be possible to prevent data of memory cells connected a word line in which data is erased at a high speed from being over-erased.

Figure 6A:
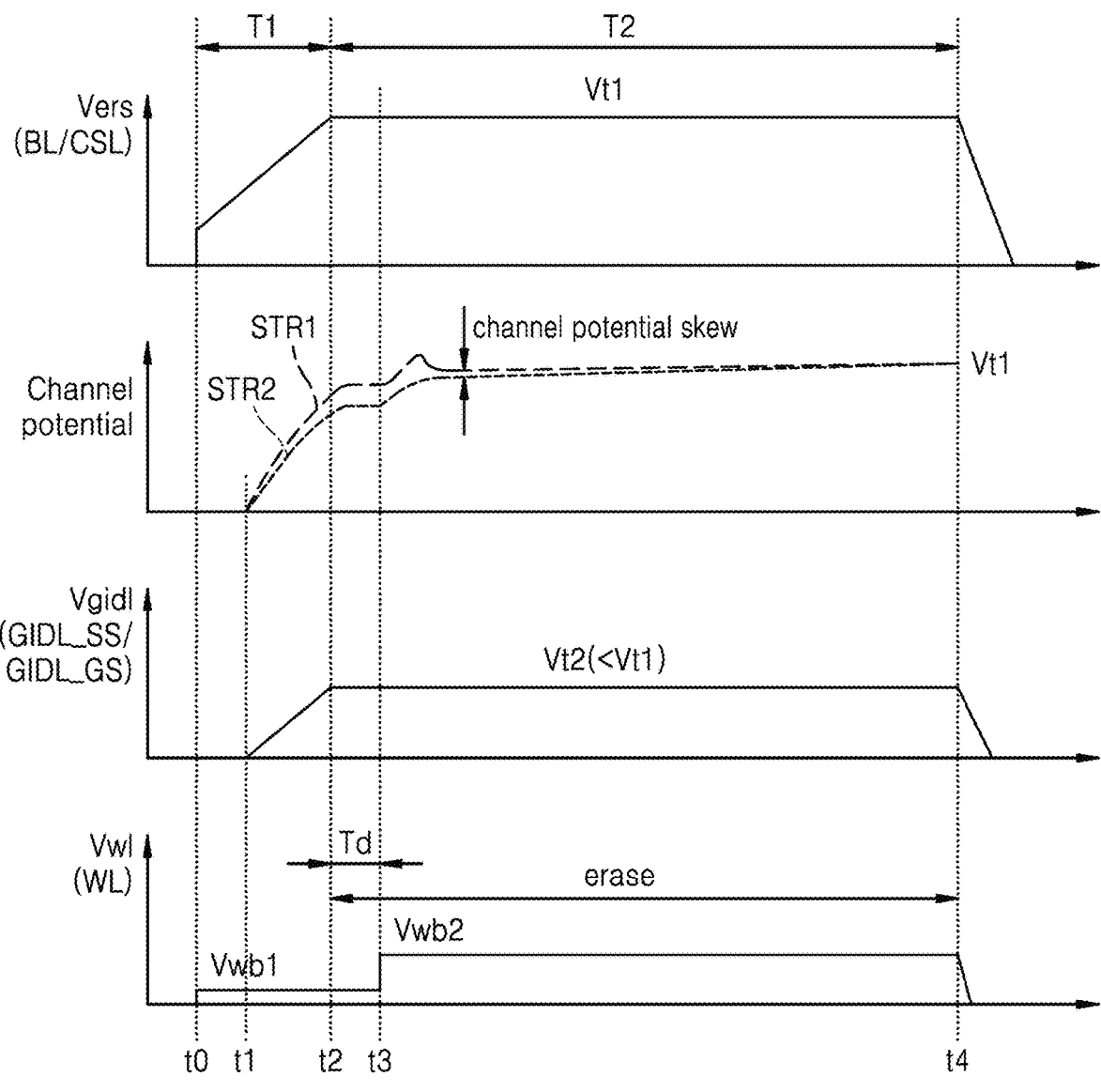
FIG. 6A is a timing diagram illustrating channel potentials of cell strings during an erase operation according to an example embodiment.
Figure 6B:
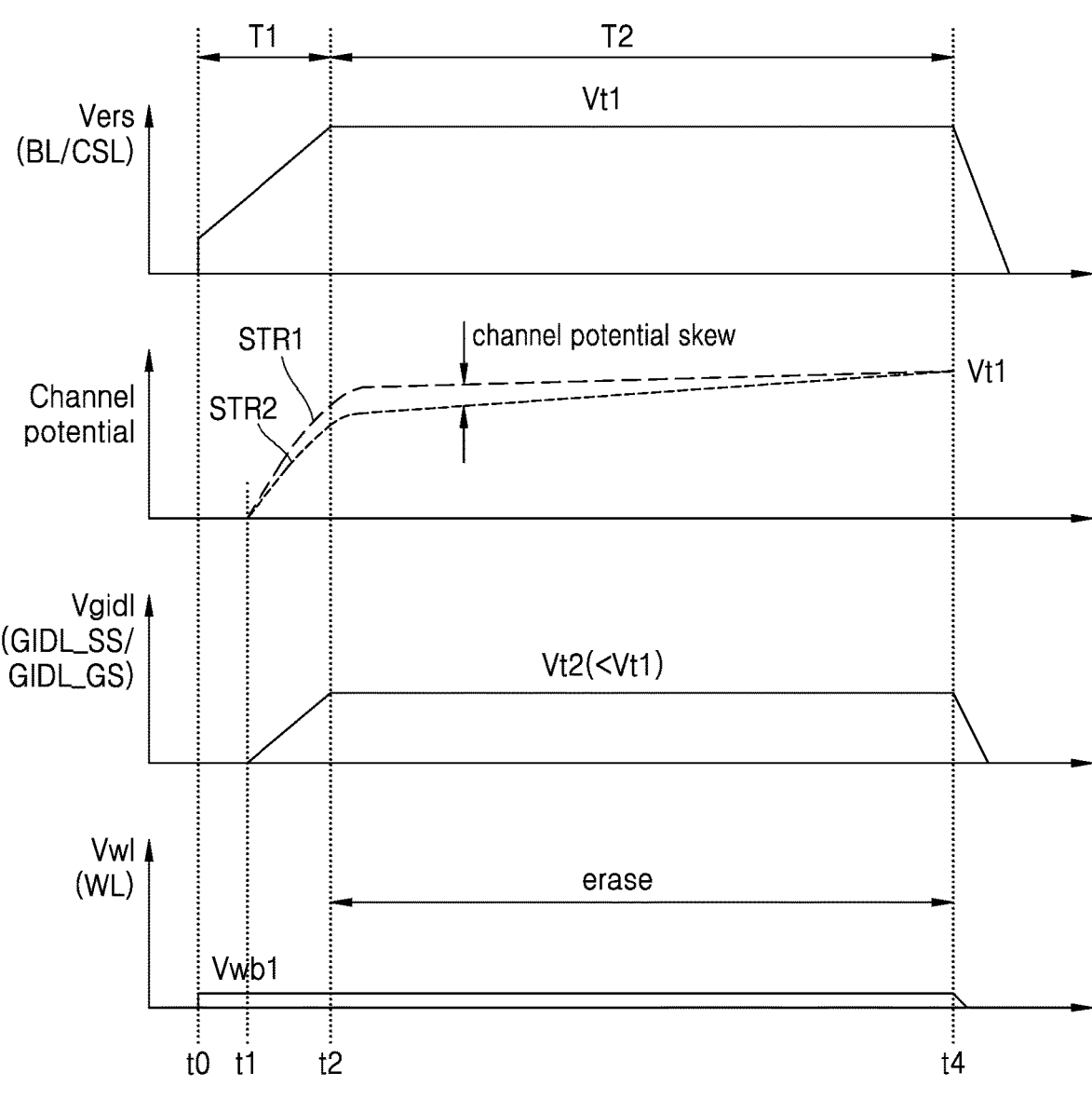
FIG. 6B is a timing diagram illustrating channel potentials of cell strings during an erase operation according to a comparative example.

FIG. 6A is a timing diagram illustrating channel potentials of first and second cell strings STR1 and STR2 during an erase operation according to an example embodiment, and FIG. 6B is a timing diagram illustrating channel potentials of first and second cell strings STR1 and STR2 during an erase operation according to a comparative example. Herein, each of the first and second cell strings STR1 and STR2 may correspond to one of the cell strings NS11, NS21, NS31, NS12, NS22, NS32, NS13, NS23, and NS33.

Referring to FIG. 6A, as the erase voltage Vers increases in the first period T1, the channel potentials of the first and second cell strings STR1 and STR2 may increase. At this time, the increase rate of the channel potential of the first cell string STR1 may be greater than the increase rate of the channel potential of the second cell string STR2. Therefore, channel potential skew may occur between the first cell string STR1 and the second cell string STR2.

In the erase method according to the inventive concept, the second bias voltage Vwb2 higher than the first bias voltage Vwb1 may be applied to the word lines WL at the fourth point in time t3 in the second period T2, the word line voltage Vwl may increase, and the channel potentials may increase in connection with the increase in the word line voltage Vwl. As a result, the channel potentials of the first cell string STR1 and the second cell string STR2 may rapidly increase at the fourth point in time t3 and the channel potential of the first cell string STR1 may momentarily overshoot. As a result, the channel potential skew between the first cell string STR1 and the second cell string STR2 may be reduced and the channel potentials may rapidly reach the erase target level Vt1.

Referring to FIG. 6B, in the erase method according to the comparative example, the word line voltage Vwl may be maintained as the first bias voltage Vwb1 in the first period T1 and the second period T2. In the second period T2, the channel potential of the first cell string STR1 and the channel potential of the second cell string STR2 may slowly increase to the erase target level Vt1.

Referring to FIGS. 6A and 6B, in the erase method according to the embodiment of the inventive concept, the channel potential skew may be more rapidly reduced than in the erase method according to the comparative example and the channel potentials may more rapidly reach the erase target level Vt1.

As speeds at which the channel potentials increase along the erase voltage Vers, that is, erase voltage set up speeds, vary between the first and second cell strings STR1 and STR2, the channel potential skew occurs between the first and second cell strings STR1 and STR2 and erase dispersion characteristics may deteriorate. In the erase method according to the embodiment of the inventive concept, by increasing a bias voltage applied to the word lines WL from the first bias voltage Vwb1 to the second bias voltage Vwb2 in an erase period, for example, the second period T2, the channel potential skew between the first and second cell strings STR1 and STR2 is rapidly reduced so that the erase dispersion characteristics may improve.

Figure 7A:
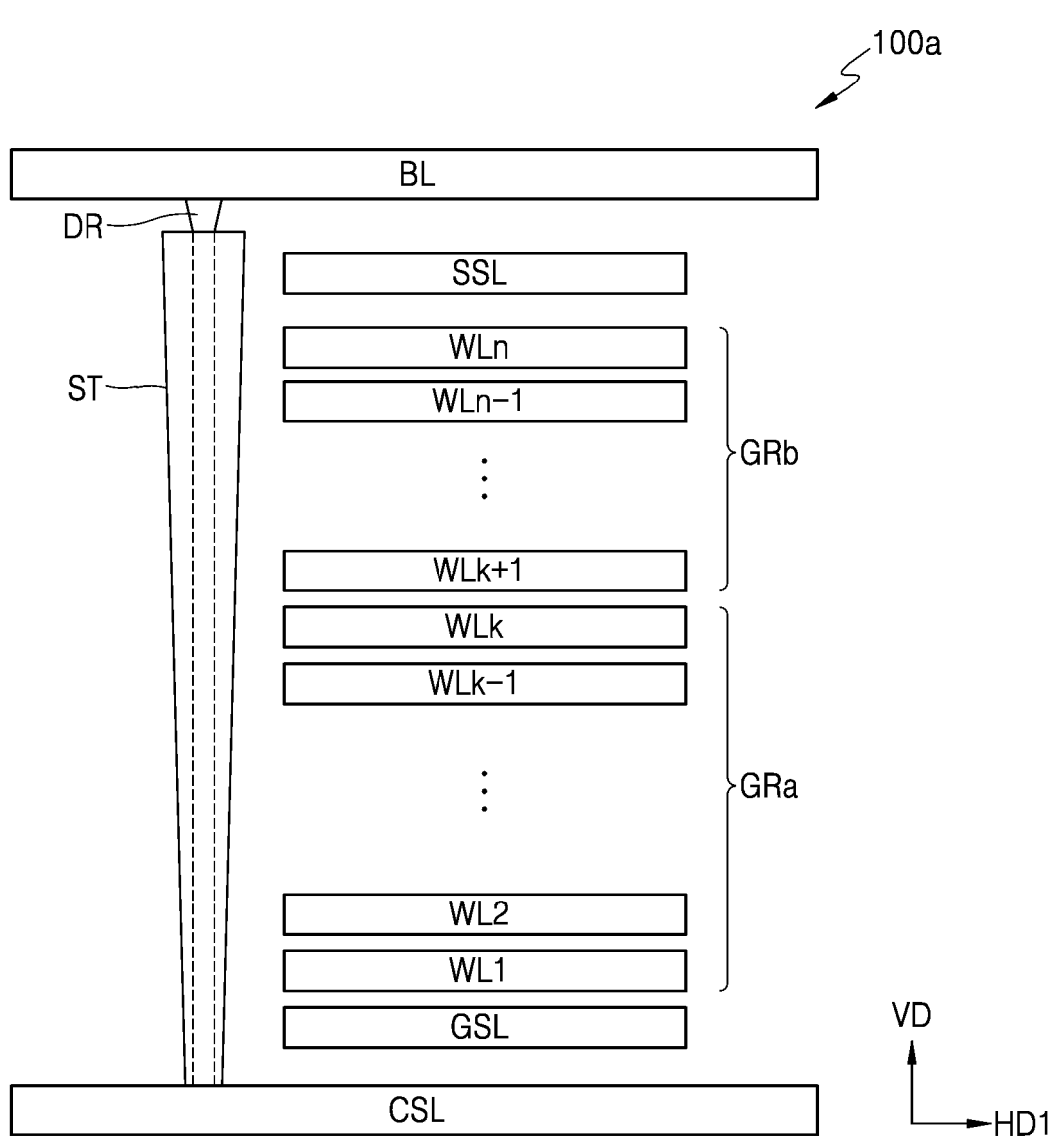
FIGS. 7A and 7B schematically illustrate memory devices according to example embodiments of the inventive concept.
Figure 7B:
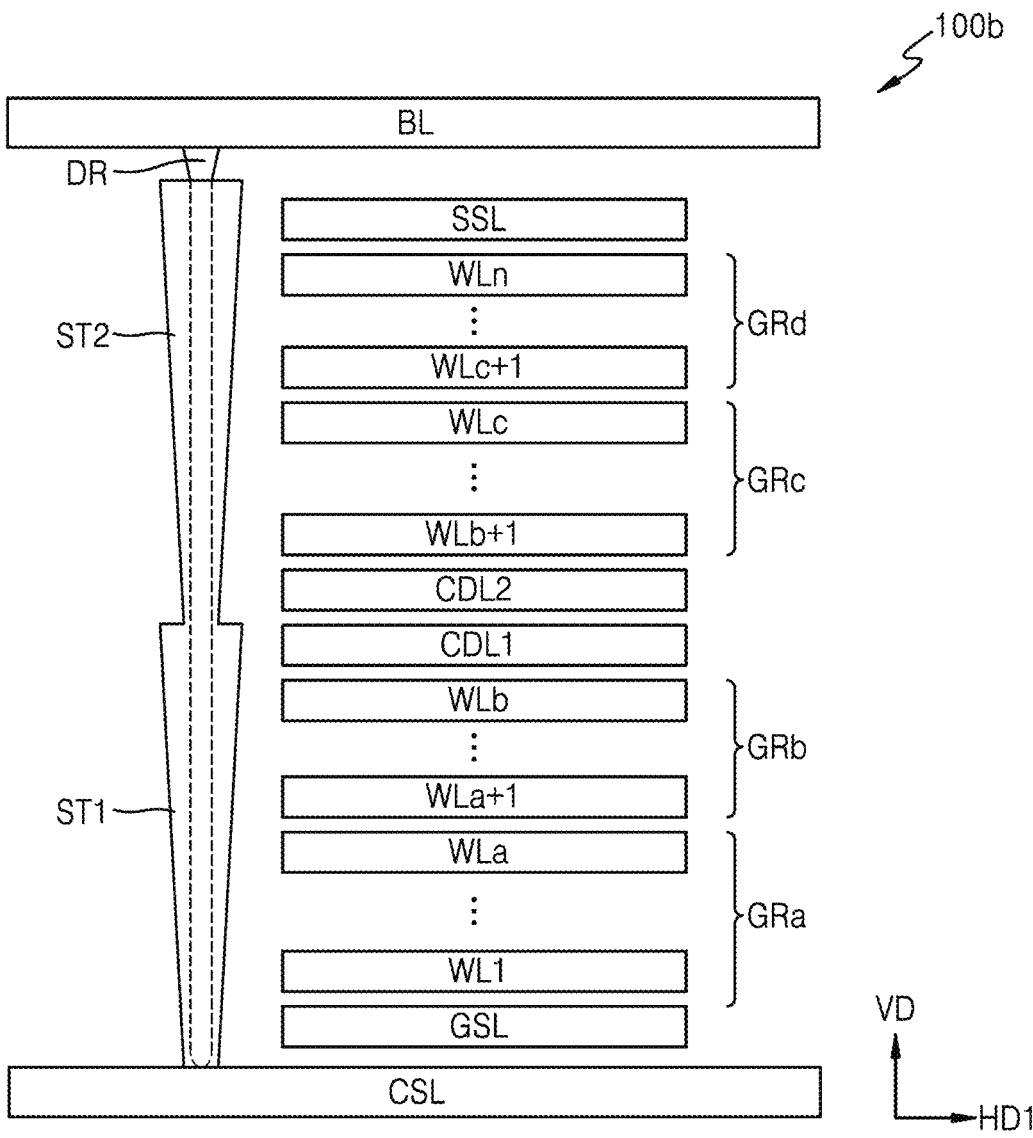

FIGS. 7A and 7B schematically illustrate memory devices according to example embodiments of the inventive concept.

Referring to FIG. 7A, a memory device 100a may include a common source line CSL and a bit line BL extending in the first horizontal direction HD1 and a memory stack ST extending in the vertical direction VD. At this time, the memory stack ST may be connected to the bit line BL through a drain DR. For example, the memory device 100a corresponds to an example of FIG. 4A and the memory stack ST may correspond to the pillar P of FIG. 4A or one of the cell strings NS11, NS21, NS31, NS12, NS22, NS32, NS13, NS23, and NS33 of FIG. 3A.

The memory device 100a may further include a plurality of word lines WL1 to WLn stacked in the vertical direction VD, a ground selection line GSL may be arranged between the common source line CSL and the word line WL1, and a string selection line SSL may be arranged between the bit line BL and the word line WLn. Although not shown, an erase control line (for example, GIDL_SS of FIG. 4A) may be further arranged between the string selection line SSL and the bit line BL and an erase control line (for example, GIDL_GS of FIG. 4A) may be further arranged between the ground selection line GSL and the common source line CSL.

In an embodiment, the plurality of word lines WL1 to WLn may be grouped into a plurality of groups including a first group GRa and a second group GRb. The first group GRa may include word lines (for example, WL1 to WLk) close to a substrate, the second group GRb may include word lines (for example, WLk+1 to WLn) far from the substrate, and k is a positive integer between 2 and n. In the embodiment, the plurality of word lines WL1 to WLn may be grouped into three or more groups.

Referring to FIG. 7B, a memory device 100b may include a common source line CSL and a bit line BL extending in the first horizontal direction HD1 and a first memory stack ST1 and a second memory stack ST2 extending in the vertical direction VD. At this time, the first memory stack ST1 may be arranged on the common source line CSL and the second memory stack ST2 may be arranged on the first memory stack ST1 and may be connected to the bit line BL through a drain DR. For example, the memory device 100b may correspond to an example of FIG. 4B and the first memory stack ST1 and the second memory stack ST2 may respectively correspond to the first memory stack ST1 and the second memory stack ST2 of FIG. 4B.

The memory device 100b may further include a plurality of word lines WL1 to WLn stacked in the vertical direction VD, a ground selection line GSL may be arranged between the common source line CSL and the word line WL1, and a string selection line SSL may be arranged between the bit line BL and the word line WLn. In addition, the memory device 100b may further include first and second junction dummy word lines CDL1 and CDL2 corresponding to a junction between the first memory stack ST1 and the second memory stack ST2. However, the inventive concept is not limited thereto, and the number of junction dummy word lines corresponding to the junction may vary according to an embodiment. In addition, according to the embodiment, the junction dummy word lines may not be arranged.

In an embodiment, the plurality of word lines WL1 to WLn may be grouped into a plurality of groups including a first group GRa, a second group GRb, a third group GRc, and a fourth group GRd. The first and second groups GRa and GRb may include word lines connected to the first memory stack ST1, and the third and fourth groups GRc and GRd may include word lines connected to the second memory stack ST2. The first group GRa may include word lines (for example, WL1 to WLa) apart from a substrate by a less distance than the word lines of the second group GRb and the second group GRb may include word lines (for example, WLa+1 to WLb) apart from a substrate by a greater distance than the word lines of the first group GRa. At this time, a and b are positive integers between 1 and n and a is less than b. The third group GRc may include word lines (for example, WLb+1 to WLc) apart from a substrate by a greater distance than the word lines of the second group GRb, the fourth group GRd may include word lines (for example, WLc+1 to WLn) apart from a substrate by a greater distance than the word lines of the third group GRc, and c is a positive integer between b and n. In the embodiment, the plurality of word lines WL1 to WLn may be grouped into five or more groups.

In some embodiments, the memory device may include three or more memory stacks, and as the number of memory stacks increases, the number of groups respectively corresponding to the plurality of word lines may increase. For example, when a memory device includes three memory stacks, the plurality of word lines WL1 to WLn may be grouped into six groups. However, the inventive concept is not limited thereto.

Figure 8A:
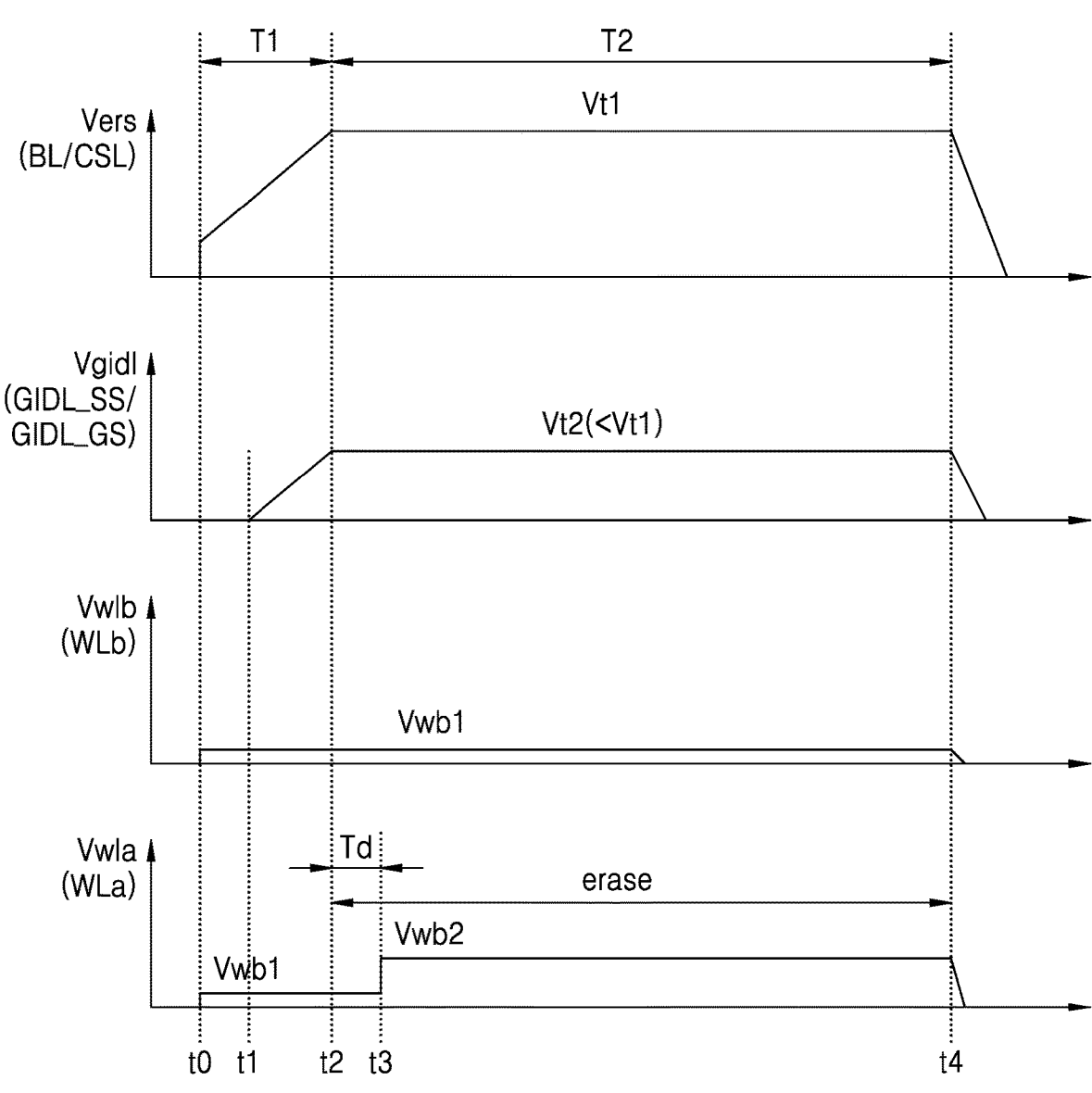
FIGS. 8A and 8B are timing diagrams illustrating erase operations according to example embodiments of the inventive concept.
Figure 8B:
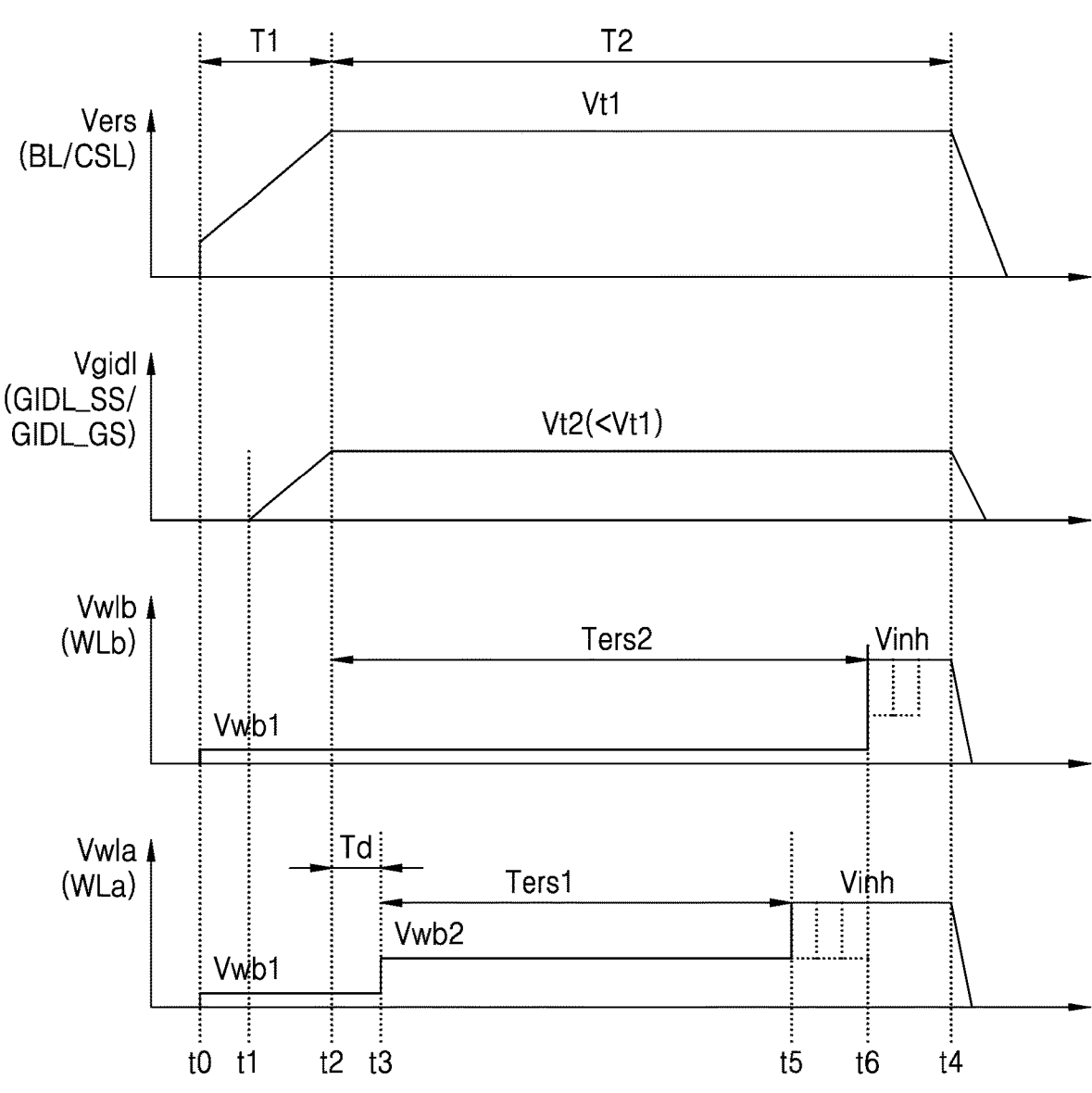

FIGS. 8A and 8B are timing diagrams illustrating erase operations according to example embodiments of the inventive concept.

Referring to FIG. 8A, the memory device 100 may apply a first bias voltage Vwb1 to a first word line WLa and a second word line WLb in the first period T1 and may apply a second bias voltage Vwb2 to the first word line WLa at a point in time of the second period T2, for example, the fourth point in time t3. In the second period T2, the first bias voltage Vwb1 may be applied to the second word line WLb like in the first period T1.

For example, the first word line WLa may be one or more word lines of the word line group (for example, GRa of FIG. 7A) under the cell strings and the second word line WLb may be one or more word lines of the word line group (for example, GRb of FIG. 7A) on the cell strings. In an embodiment, the second word line WLb may include the farthest word line from the substrate among word lines WL between a bit line BL and a common source line CSL.

As another example, a speed at which data in the first word line WLa is erased may be higher than a speed at which data in the second word line WLb is erased. The second word line WLb may include a word line in which data is erased at the lowest speed.

Referring to FIG. 8B, the memory device 100 may apply the erase inhibit voltage Vinh to the first and second word lines WLa and WLb at the end portion of the second period T2. Points in time at which the erase inhibit voltage Vinh is applied to the first and second word lines WLa and WLb may vary.

For example, the erase inhibit voltage Vinh may be applied to the first word line WLa at the sixth point in time t5 and may be applied to the second word line WLb at a seventh point in time t6. An erase period Ters2 of the second word line WLb may be longer than an erase period Ters1 of the first word line WLa. However, the inventive concept is not limited thereto, and the erase period Ters2 of the second word line WLb may be shorter than the erase period Ters1 of the first word line WLa.

When each of the first word line WLa and the second word line WLb includes a plurality of neighboring word lines, erase points in time of the plurality of word lines may vary. In other words, the erase period may be adjusted by word line.

As described above with reference to FIGS. 8A and 8B, in the second period T2, a word line voltage of some of the plurality of word lines of the memory cell array (110 of FIG. 1) may increase and the other word lines may maintain the same word line voltage as that in the first period T1. In addition, the erase period may be adjusted by word line. As a result, a difference in erase speed among the cell strings and the word lines may be compensated for so that the erase dispersion characteristics of the memory cell array 110 may improve.

Figure 9A:
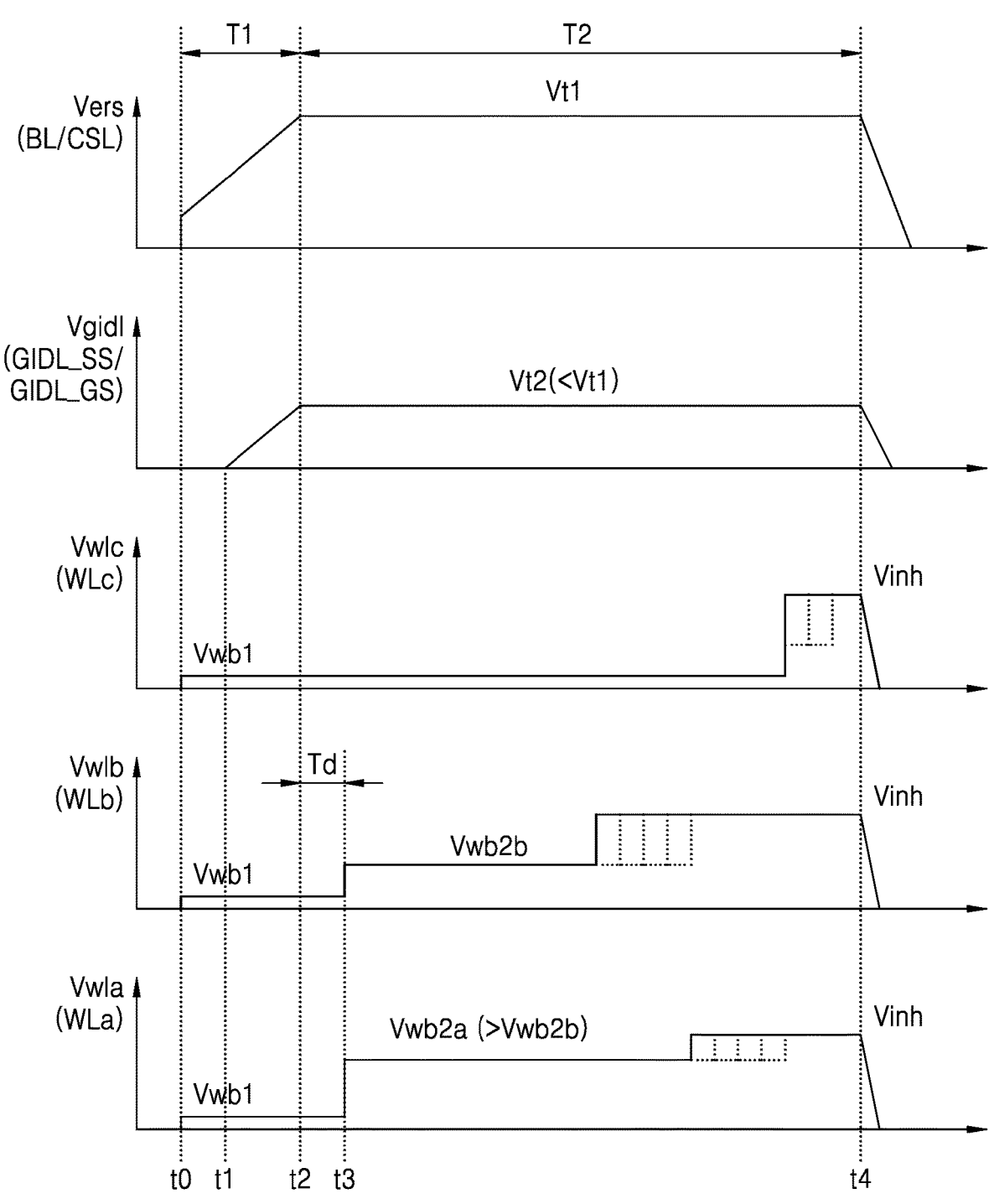
FIGS. 9A and 9B are timing diagrams illustrating erase operations according to example embodiments of the inventive concept.
Figure 9B:
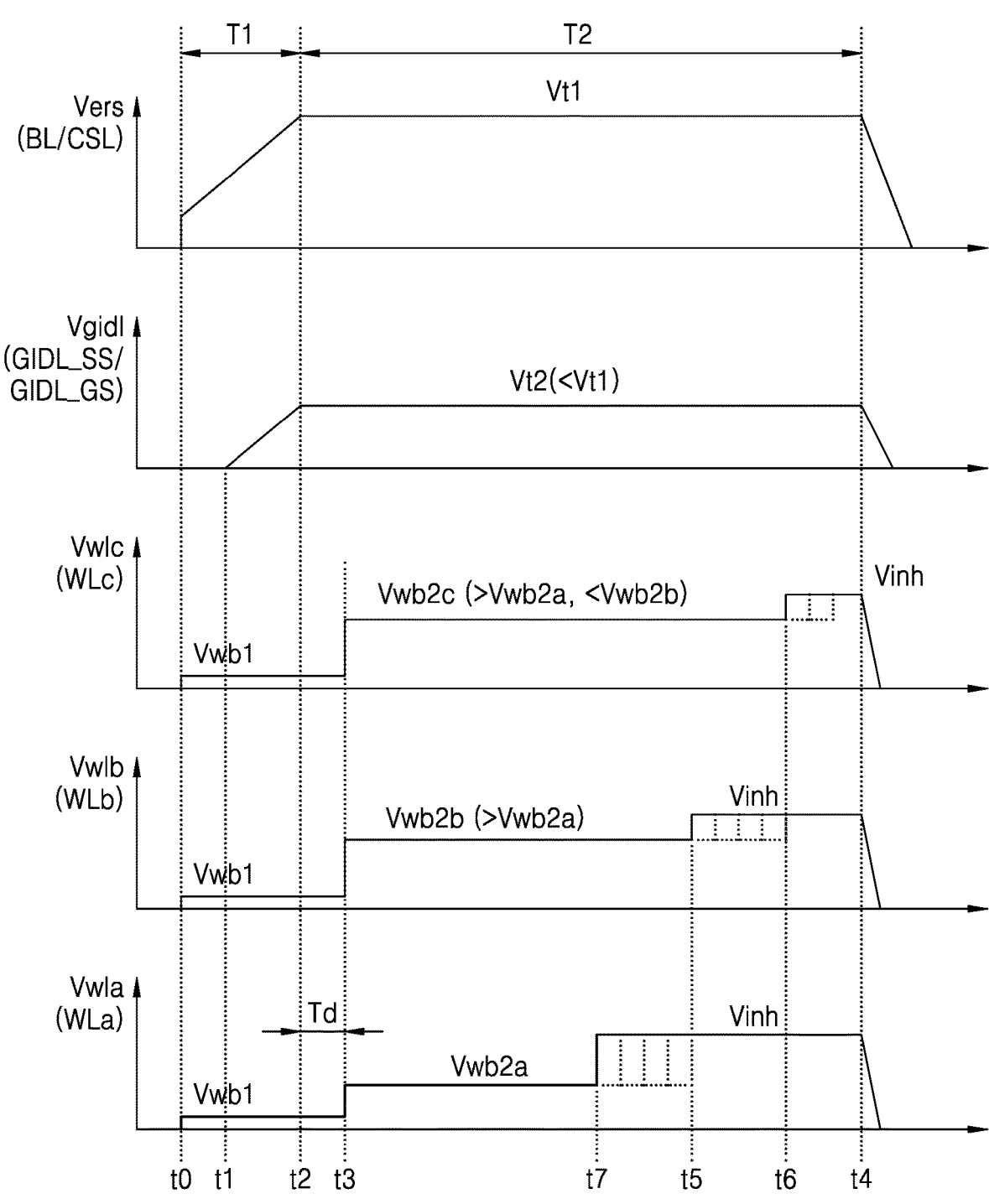

FIGS. 9A and 9B are timing diagrams illustrating erase operations according to example embodiments of the inventive concept.

Referring to FIG. 9A, the memory device 100 may control voltages of the plurality of word lines of the memory cell array 110 by a group. The memory device 100 may apply the first bias voltage Vwb1 to the plurality of word lines in the first period T1 and may increase word line voltages Vwla and Vwlb of the first word line WLa of the first group GRa and the second word line WLb of the second group GRb in the second period T2. In the second period T2, the memory device 100 may maintain a voltage of the third word line WLc of the third group to be the same as that in the first period T1. As a non-limiting example, the first group may be positioned at a lower end of the cell strings, the second group may be positioned in the middle of the cell strings, and the third group may be positioned at an upper end of the cell strings. In an embodiment, an erase speed of the first group may be the lowest.

In the second period T2, a second bias voltage Vwb2a applied to the first word line WLa may be different from a second bias voltage Vwb2b applied to the second word line WLb. For example, the second bias voltage Vwb2a applied to the first word line WLa may be higher than the second bias voltage Vwb2b applied to the second word line WLb. However, the inventive concept is not limited thereto, and various voltages lower than or the same as the erase inhibit voltage Vinh may be applied to the word lines as the second bias voltage.

In an embodiment, as described above with reference to FIG. 5B, after the second bias voltages Vwb2a and Vwb2b are applied to the word lines of the first and second groups in the second period T2, for example, at the end portion of the second period T2, the erase inhibit voltage Vinh may be applied to the word lines. Points in time at which the erase inhibit voltage Vinh is applied may vary by group and points in time at which the erase inhibit voltage Vinh is applied to the word lines of the same group may vary.

Referring to FIG. 9B, the memory device 100 may increase the word line voltages of the plurality of word lines of the memory cell array (110 of FIG. 1) in the second period T2. The memory device 100 may apply the first bias voltage Vwb1 to the first to third word lines WLa, WLb, and WLc in the first period T1 and may apply second bias voltages Vwb2a, Vwb2b, and Vwb2c to the first to third word lines WLa, WLb, and WLc in the second period T2. As illustrated in FIG. 9B, the second bias voltage Vwb2a applied to the first word line WLa of the first group, the second bias voltage Vwb2b applied to the second word line WLb, and the second bias voltage Vwb2c applied to the third word line WLc may be different from one another. For example, the second bias voltage Vwb2c may be higher than the second bias voltage Vwb2a and lower than the second bias voltage Vwb2b. In the cell strings, the second bias voltages of each group may be set based on a position of each group or erase speeds of the word lines of each group.

Figure 10:
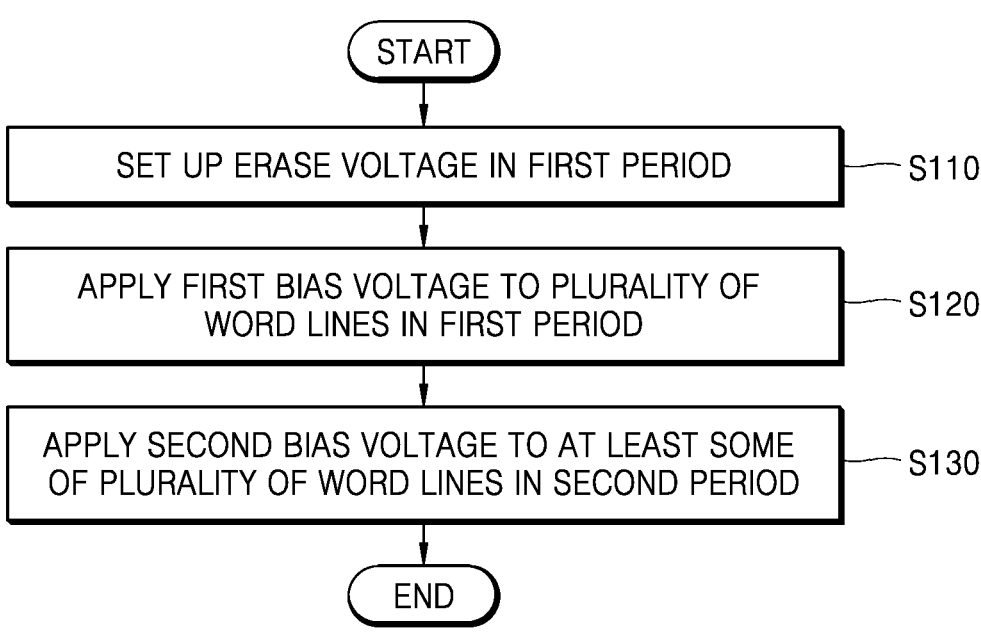
FIG. 10 is a flowchart illustrating an erase operation according to an example embodiment.

FIG. 10 is a flowchart illustrating an erase method of a memory device 100 according to an example embodiment. The erase method of FIG. 10 may be performed by the memory device 100 of FIG. 1 and the erase method of the memory device 100 may be applied to the current embodiment with reference to FIGS. 1, 2, 3A to 9A, 3B to 5B, 3C, 7B to 9B, and 10 to 12.

Referring to FIG. 10, the memory device 100 may set up the erase voltage in the first period in operation S110. The first period may be referred to as the erase voltage set up period. In the first period, the erase voltage may be applied to the bit lines and/or the common source line and may increase to the erase target level with a predetermined slope. At this time, the erase control voltage may be applied to the erase control line connected to the erase control transistor and may increase to the control target level.

The memory device 100 may respectively apply the first bias voltage to the plurality of word lines in the first period in operation S120. When the erase voltage and the erase control voltage are set up, the memory device 100 may apply the first bias voltage to the plurality of word lines. The first bias voltage may include the ground voltage 0 V or may have the voltage level close to that of the ground voltage 0 V.

The memory device 100 may apply the second bias voltages to at least some of the plurality of word lines in the second period after the first period in operation S130. The second bias voltages may be higher than the first bias voltage. In other words, the memory device 100 may increase the voltages of at least some of the plurality of word lines after the erase voltage is set up. As a result, the channel potentials may increase and the channel potential skew among the cell strings may be reduced.

In the embodiment, the memory device 100 may increase the word line voltages of the plurality of word lines in the second period. In the embodiment, in the second period, the memory device 100 may increase the word line voltages of some of the plurality of word lines and may maintain the word line voltages of the remaining word lines to be the same as that in the first period. In the embodiment, the voltage levels of the second bias voltages respectively applied to at least some of the plurality of word lines may be different from one another. For example, the voltage levels of the second bias voltages may vary by word line group. At this time, the word line groups may be classified according to the positions in the cell strings or the erase speeds of the word lines.

In the embodiment, the memory device 100 may apply the erase inhibit voltage to the plurality of word lines after the second bias voltages are applied to at least some of the plurality of word lines. The erase inhibit voltage may be higher than or the same as the second bias voltages.

Figure 11:
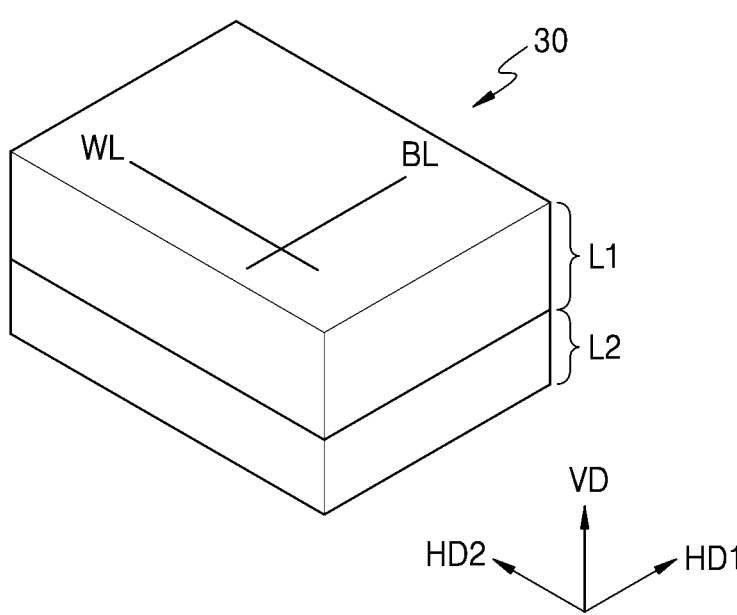
FIG. 11 illustrates a memory device having a cell over peri (COP) structure according to an example embodiment.

FIG. 11 illustrates a memory device 30 having a cell over peri (COP) structure according to an example embodiment.

Referring to FIGS. 2 and 11, the memory device 30 may include a first semiconductor layer L1 and a second semiconductor layer L2 and the first semiconductor layer L1 may be stacked on the second semiconductor layer L2 in the vertical direction VD. Specifically, the second semiconductor layer L2 may be arranged under the first semiconductor layer L1 in the vertical direction VD. The memory device 100 of FIG. 1 may have a COP structure like the memory device 30.

In the embodiment, the memory cell array 110 may be formed in the first semiconductor layer L1 and the control logic circuit 120, the page buffer circuit 140, the voltage generator 150, and the row decoder 130 may be formed in the second semiconductor layer L2. Accordingly, the memory device 30 may have a structure in which the memory cell array 110 is arranged on partial peripheral circuits, that is, the COP structure. The COP structure may effectively reduce a horizontal area and may increase density of the memory device 30.

In an embodiment, the second semiconductor layer L2 may include a substrate and, by forming semiconductor devices such as a transistor and a pattern for wiring the semiconductor devices on the substrate, circuits may be formed in the second semiconductor layer L2. After the circuits are formed in the second semiconductor layer L2, the first semiconductor layer L1 including the memory cell array 110 may be formed and patterns for electrically connecting the word lines WL and the bit lines BL of the memory cell array 110 to the circuits formed in the second semiconductor layer L2 may be formed.

Figure 12:
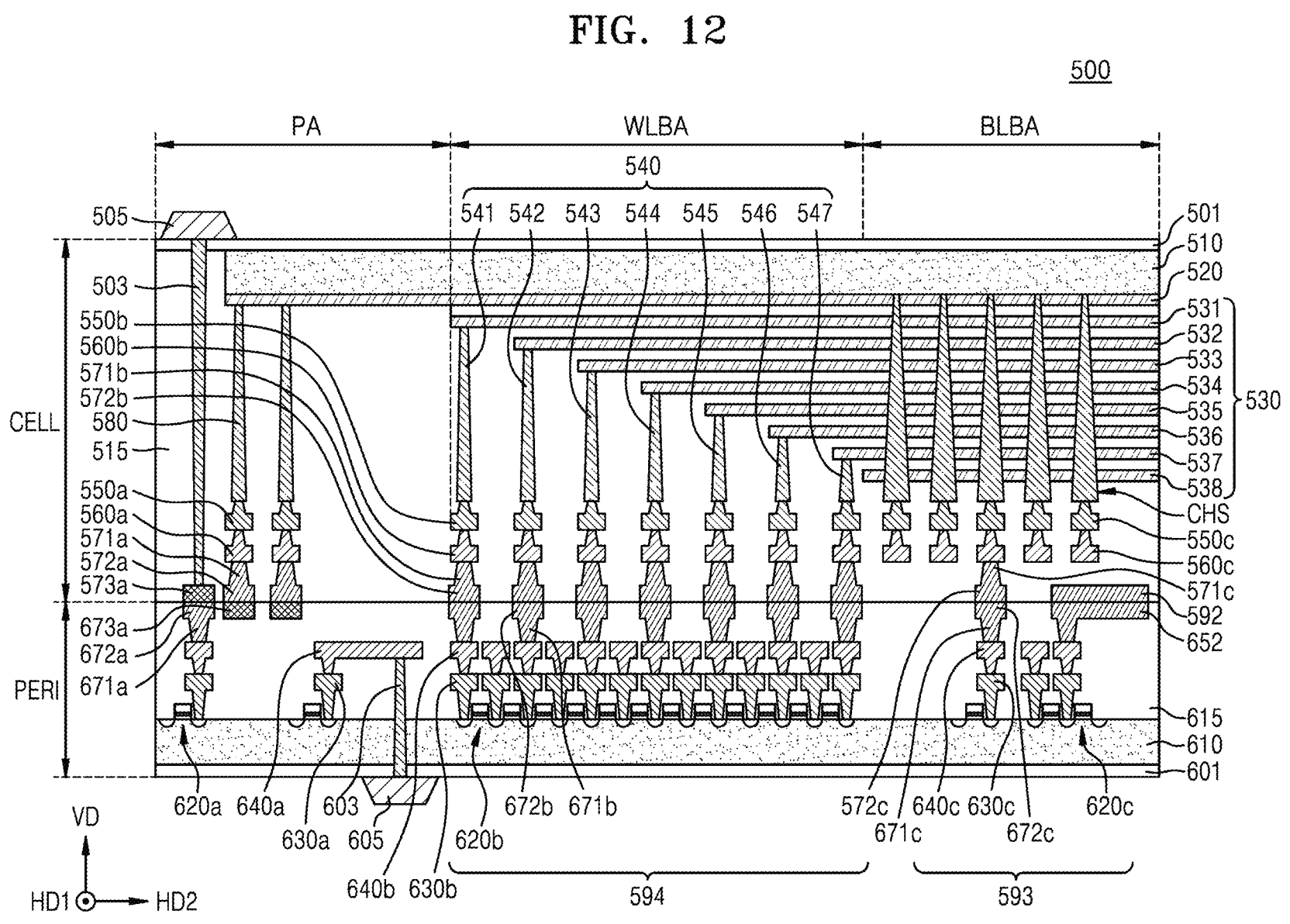

FIG. 12 is a cross-sectional view illustrating a memory device 500 having a bonding vertical NAND (B-VNAND) structure according to an example embodiment. When non-volatile memory included in the memory device is implemented by B-VNAND type flash memory, the non-volatile memory may have the structure illustrated in FIG. 12.

Referring to FIG. 12, a cell region CELL of the memory device 500 may correspond to the first semiconductor layer L1 and a peripheral circuit region PERI of the memory device 500 may correspond to the second semiconductor layer L2. Each of the peripheral circuit region PERI and the cell region CELL of the memory device 500 may include an external pad bonding region PA, a word line bonding region WLBA, and a bit line bonding region BLBA. For example, the plurality of word lines WL, the plurality of string selection lines SSL, the plurality of ground selection lines GSL, and the memory cell array 110 of FIG. 2 may be formed in the first semiconductor layer L1 and the control logic circuit 120, the page buffer circuit 140, the voltage generator 150, and the row decoder 130 of FIG. 2 may be formed in the second semiconductor layer L2.

The memory device 500 may have a chip to chip (C2C) structure. In the C2C structure, after manufacturing an upper chip including the cell region CELL on a first wafer and manufacturing a lower chip including the peripheral circuit region PERI on a second wafer different from the first wafer, the upper chip and the lower chip may be connected to each other by a bonding method. For example, in the bonding method, a bonding metal formed in the uppermost metal layer of the upper chip may be electrically connected to a bonding metal formed in the uppermost metal layer of the lower chip. For example, when the bonding metal includes copper (Cu), the bonding method may include a CU—CU bonding method. In another embodiment, the bonding metal may include aluminum (Al) or tungsten (W) as well as Cu.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c formed on the first metal layers 630a, 630b, and 630c. Each of the circuit elements 620a, 620b, and 620c may include one or more transistors. In an embodiment, the first metal layers 630a, 630b, and 630c may include W with high resistance and the second metal layers 640a, 640b, and 640c may include Cu with low resistance.

In the current specification, only the first metal layers 630a, 630b, and 630c and the second metal layers 640a, 640b, and 640c are illustrated. However, the inventive concept is not limited thereto, and one or more metal layers may be further formed on the second metal layers 640a, 640b, and 640c. At least parts of the one or more metal layers formed on the second metal layers 640a, 640b, and 640c may include Al with lower resistance than that of Cu forming the second metal layers 640a, 640b, and 640c.

The interlayer insulating layer 615 may be arranged on the first substrate 610 to cover the plurality of circuit elements 620a, 620b, and 620c, the first metal layers 630a, 630b, and 630c, and the second metal layers 640a, 640b, and 640c and may include an insulating material, such as silicon oxide or silicon nitride. Lower bonding metals 61b and 672b may be formed on the second metal layers 640b of the word line bonding region WLBA. In the word line bonding region WLBA, the lower bonding metals 671b and 672b of the peripheral circuit region PERI may be electrically connected to upper bonding metals 571b and 572b of the cell region CELL and the lower bonding metals 671b and 672b and the upper bonding metals 571b and 572b may include Al, Cu, or W.

The cell region CELL may provide at least one memory block. The cell region CELL may include a second substrate 510 and a common source line 520. A plurality of word lines 531, 532, 533, 534, 535, 536, 537, and 538 (i.e., 530) may be stacked on a top surface of the second substrate 510 in the vertical direction VD. The plurality of string selection lines and the plurality of ground selection lines may be respectively arranged on and under the plurality of word lines 530 and the plurality of word lines 530 may be arranged between the plurality of string selection lines and the plurality of ground selection lines.

In the bit line bonding region BLBA, channel structures CHS may extend to be perpendicular to the top surface of the second substrate 510 and may pass through the plurality of word lines 530, the plurality of string selection lines, and the plurality of ground selection lines. Each of the channel structures CHS may include a data storage layer, a channel layer, and a buried insulating layer and the channel layer may be electrically connected to first metal layers 550c and second metal layers 560c. For example, the first metal layers 550c may include bit line contacts and the second metal layers 560c may include bit lines. In an embodiment, the second metal layers 560c may extend in the first horizontal direction HD1 parallel to the top surface of the second substrate 510.

In an embodiment, a region in which the channel structures CHS and the second metal layers 560c are arranged may be defined as the bit line bonding region BLBA. The second metal layers 560c may be electrically connected to the circuit elements 620c providing a page buffer 593 of the peripheral circuit region PERI in the bit line bonding region BLBA. The page buffer 593 may correspond to the page buffer circuit 140 of FIG. 2. For example, the second metal layers 560c may be connected to the upper bonding metals 571c and 572c of the cell region CELL and the upper bonding metals 571c and 572c may be connected to the lower bonding metals 671c and 672c connected to the circuit elements 620c of the page buffer 593. Accordingly, the page buffer 593 may be connected to the second metal layers 560c through the upper and lower bonding metals 571c, 572c, 671c, and 672c.

In an embodiment, the memory device 500 may further include a through electrode THV arranged in the bit line bonding region BLBA. The through electrode THV may extend in the vertical direction VD through the plurality of word lines 530. The through electrode THV may be connected to the common source line 520 and/or the second substrate 510. Although not shown, an insulating ring may be arranged around the through electrode THV and the through electrode THV may be insulated from the plurality of word lines 530.

In the word line bonding region WLBA, the plurality of word lines 530 may extend in the second horizontal direction HD2 parallel to the top surface of the second substrate 510 and may be connected to a plurality of cell contact plugs 541, 542, 543, 544, 545, 546, and 547 (i.e., 540). The plurality of word lines 530 may be connected to the plurality of cell contact plugs 540 in pads provided by extending some of the plurality of word lines 530 in the vertical direction VD to have different lengths. First metal layers 550b and second metal layers 560b may be sequentially connected to tops of the plurality of cell contact plugs 540 connected to the plurality of word lines 530. The plurality of cell contact plugs 540 may be connected to the peripheral circuit region PERI through the upper bonding metals 571b and 572b of the cell region CELL and the lower bonding metals 671b and 672b of the peripheral circuit region PERI in the word line bonding region WLBA.

The plurality of cell contact plugs 540 may be electrically connected to the circuit elements 620b providing a row decoder 594 in the peripheral circuit region PERI. The row decoder 594 may correspond to the row decoder 130 of FIG. 2. In an embodiment, an operating voltage of the circuit elements 620b providing the row decoder 594 may be different from an operating voltage of the circuit elements 620c providing the page buffer 593. For example, the operating voltage of the circuit elements 620c providing the page buffer 593 may be greater than the operating voltage of the circuit elements 620b providing the row decoder 594.

A common source line contact plug 580 may be arranged in the external pad bonding region PA. The common source line contact plug 580 may include a conductive material such as a metal, a metal compound, or polysilicon and may be electrically connected to the common source line 520. First metal layers 550a and second metal layers 560a may be sequentially stacked on the common source line contact plug 580. For example, a region in which the common source line contact plug 580, the first metal layers 550a, and the second metal layers 560a are arranged may be defined as the external pad bonding region PA.

On the other hand, first and second input and output pads 605 and 505 may be arranged in the external pad bonding region PA. A lower insulating layer 601 covering a bottom surface of the first substrate 610 may be formed under the first substrate 610 and the first input and output pad 605 may be formed on the lower insulating layer 601. The first input and output pad 605 may be connected to at least one of the plurality of circuit elements 620a, 620b, and 620c arranged in the peripheral circuit region PERI through a first input and output contact plug 603 and may be separated from the first substrate 610 by the lower insulating layer 601. In addition, a side insulating layer may be arranged between the first input and output contact plug 603 and the first substrate 610 to electrically isolate the first input and output contact plug 603 from the first substrate 610.

An upper insulating layer 501 covering the top surface of the second substrate 510 may be formed on the second substrate 510 and the second input and output pad 505 may be arranged on the upper insulating layer 501. The second input and output pad 505 may be connected to at least one of the plurality of circuit elements 620a, 620b, and 620c arranged in the peripheral circuit region PERI through a second input and output contact plug 503.

According to the embodiments, the second substrate 510 and the common source line 520 may not be arranged in a region in which the second input and output contact plug 503 is arranged. In addition, the second input and output pad 505 may not overlap the plurality of word lines 530 in a third direction (a Z axis direction). The second input and output contact plug 503 may be separated from the second substrate 510 to run parallel to the top surface of the second substrate 510 and may be connected to the second input and output pad 505 through an interlayer insulating layer 515 of the cell region CELL.

According to the embodiments, the first input and output pad 605 and the second input and output pad 505 may be optionally formed. For example, the memory device 500 may include only the first input and output pad 605 arranged on the first substrate 610 or only the second input and output pad 505 arranged on the second substrate 510. Alternatively, the memory device 500 may include both the first input and output pad 605 and the second input and output pad 505. In each of the external pad bonding region PA and the bit line bonding region BLBA included in each of the cell region CELL and the peripheral circuit region PERI, a metal pattern of the uppermost metal layer may be provided as a dummy pattern or the uppermost metal layer may be empty.

In the external pad bonding region PA, the memory device 500 may form lower metal patterns 673a electrically connected to upper bonding metals 571a and 572a of the cell region CELL in the uppermost metal layer of the peripheral circuit region PERI to correspond to the upper metal patterns 573a formed in the uppermost metal layer of the cell region CELL. The lower metal patterns 673a formed in the uppermost metal layer of the peripheral circuit region PERI may not be connected to additional contacts in the peripheral circuit region PERI. Similarly, in the external pad bonding region PA, to correspond to the lower metal patterns 673a formed in the uppermost metal layer of the peripheral circuit region PERI, the upper metal patterns 573a electrically connected to lower bonding metals 671a and 672a of the peripheral circuit region PERI in the same form as the lower metal patterns 673a of the peripheral circuit region PERI may be formed in the uppermost metal layer of the cell region CELL.

In addition, in the bit line bonding region BLBA, to correspond to a lower metal pattern 652 formed in the uppermost metal layer of the peripheral circuit region PERI, an upper metal pattern 592 in the same form as the lower metal pattern 652 may be formed in the uppermost metal layer of the cell region CELL. A contact may not be formed on the upper metal pattern 592 formed in the uppermost metal layer of the cell region CELL.

In example embodiments, the memory device 500 of FIG. 12 may be one of the memory device 100, 100a, and 100b described with reference to FIGS. 1, 2, 7A, and 7B. For example, the cell region CELL may correspond to the memory cell array 110 of FIGS. 1 and 2, and the peripheral circuit region PERI may correspond to at least one of the row decoder 130, the voltage generator 150, the page buffer circuit 140, and the control logic circuit 120 of FIG. 2.

Figure 13:
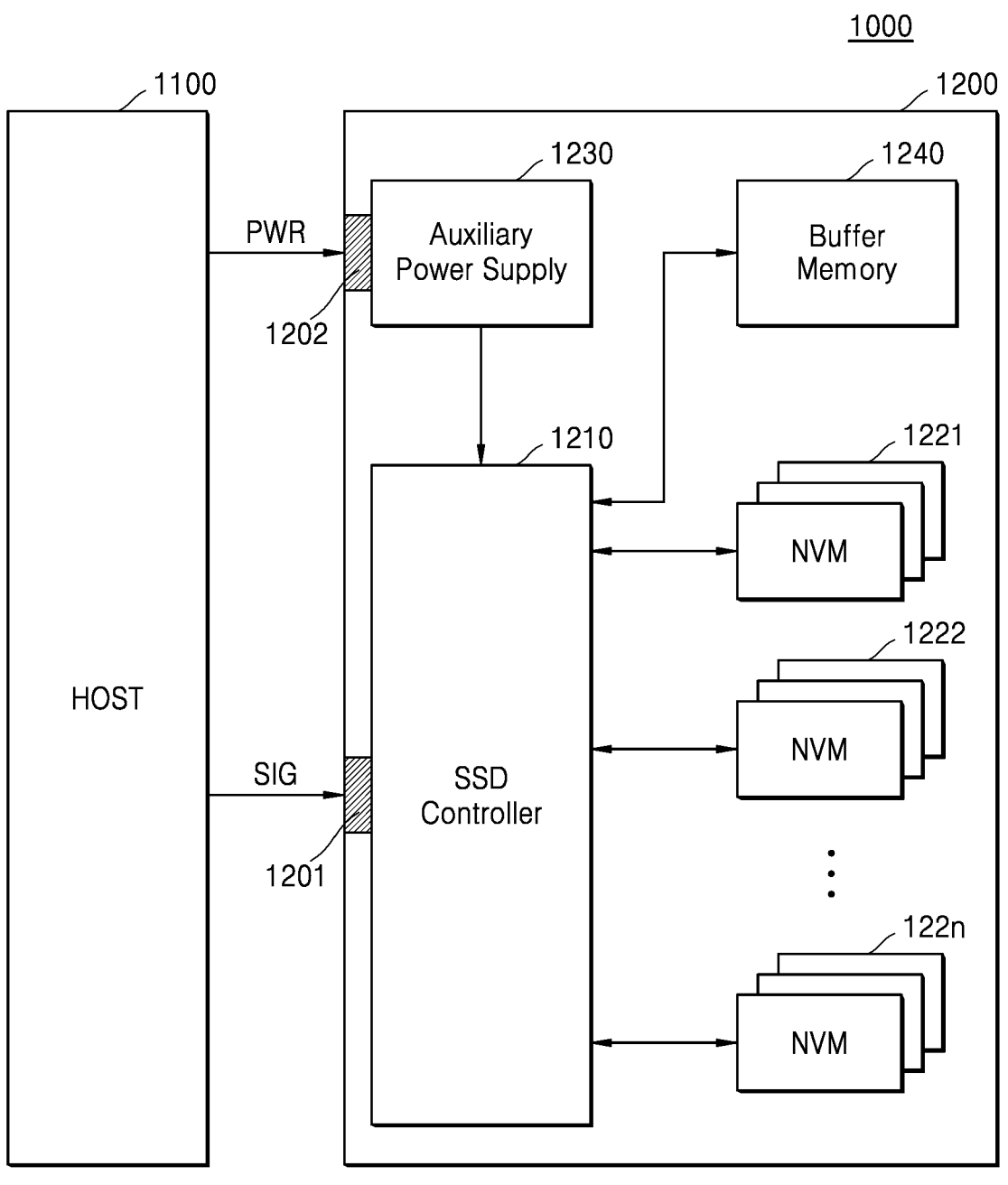
FIG. 13 is a block diagram illustrating a solid state drive (SSD) system to which a memory device according to an example embodiment is applied.

FIG. 13 is a block diagram illustrating an SSD system 1000 to which a memory device according to an example embodiment is applied.

The SSD system 1000 may be provided in a data center including dozens of host machines or servers running hundreds of virtual machines. For example, the SSD system 1000 may include a computing device such as a laptop computer, a desktop computer, a server computer, a workstation, a portable communication terminal, a personal digital assistant (PDA), a portable multimedia player (PMP), a smartphone, or a tablet PC, a virtual machine, or a virtual computing device thereof. Alternatively, the SSD system 1000 may be a part of components included in a computing system such as a graphics card. The SSD system 1000 is not limited to hardware configuration described hereinafter and may have other configurations.

Referring to FIG. 13, the SSD system 1000 may include a host 1100 and an SSD 1200.

The host 1100 may mean a data processing device capable of processing data. The host 1100 may run an operating system (OS) and/or various applications. The host 1110 may include a central processing unit (CPU), a graphics processing unit (GPU), a neural processing unit (NPU), a digital signal processor (DSP), a microprocessor, or an application processor (AP). In an embodiment, the SSD system 1000 may be included in a mobile device and the host 1100 may be implemented by the AP. In an embodiment, the host 1100 may be implemented by a system-on-chip (SoC) and thus may be embedded in the SSD system 1000. The host 1100 may include one or more processors. The host 1100 may include a multi-core processor.

The host 1100 may be configured to execute commands that may be executed by one or more machines, software, FW, or a combination thereof. The host 1100 may control a data processing operation for the SSD 1200. For example, the host 1100 may control a data read operation, a program operation, an erase operation, and a correction operation of a cell from which data is erased of the SSD 1200.

The host 1100 may communicate with the SSD 1200 by using various protocols. For example, the host 1100 may communicate with the SSD 1200 by using an interface protocol such as a peripheral component interconnect-express (PCI-E), an advanced technology attachment (ATA), a serial ATA (SATA), a parallel ATA (PATA), or a serial attached small computer system interface (SCSI) (SAS). In addition, various interface protocols such as a UFS, a universal serial bus (USB), a multi-media card (MMC), an enhanced small disk interface (ESDI), or integrated drive electronics (IDE) may be applied to the protocol between the host 1100 and the SSD 1200.

The SSD 1200 transmits and receives a signal SIG to and from the host 1100 through a signal connector 1201 and receives power PWR through a power connector 1202. The SSD 1200 may include an SSD controller 1210, an auxiliary power supply 1230, a buffer memory 1240, and memory devices 1221, 1222, . . . and 122n, n is being a natural number greater than 2. Each of the memory devices 1221 to 122n may include vertically stacked NAND flash memory devices. At this time, the SSD 1200 may be implemented by using the embodiments described above with reference to FIGS. 1, 2, 3A to 9A, 3B to 5B, 3C, 7B to 9B, and 10 to 12. At least one of the memory devices 1221 to 122n may perform the erase operation by the erase method according to the embodiments disclosed above. At least one of the memory devices 1221 to 122n may increase the channel potentials of the cell strings by increasing the voltages of at least some of the plurality of word lines of the memory cell array after the erase voltage is set up. As a result, the erase dispersion characteristics of the memory cell array of the at least one of the memory devices 1221 to 122n may improve.

While the inventive concept has been particularly shown and described with reference to embodiments thereof, it will be understood that various changes in form and details may be made therein without departing from the spirit and scope of the following claims.

What is claimed is:

1. A non-volatile memory device comprising:
   a memory cell array including a plurality of cell strings extending on a substrate in a vertical direction, each of the plurality of cell strings comprising:
   a first end and a second end;
   a plurality of memory cells connected in series between a third end and a fourth end, and respectively connected to a plurality of word lines;
   a string selection transistor having a first end and a second end connected to the third end;
   a ground selection transistor having a first end and a second end connected to the fourth end; and
   an erase control transistor having a first end connected to at least one of the first ends of the string selection transistor and the ground selection transistor and a second end connected to at least one of the first end and the second end of each of the plurality of cell strings; and
   a row decoder configured to apply a first bias voltage to the plurality of word lines in a first period in which an erase voltage applied to the second end of the erase control transistor increases to a target level and to apply a second bias voltage higher than the first bias voltage to at least some of the plurality of word lines in a second period after the first period, during an erase operation for the memory cell array.

2. The non-volatile memory device of claim 1, wherein the row decoder is configured to apply an erase inhibit voltage higher than the second bias voltage to the plurality of word lines after applying the second bias voltage to the at least some of the plurality of word lines.

3. The non-volatile memory device of claim 1, wherein the row decoder is configured to apply the first bias voltage word lines other than the at least some of the plurality of word lines in the second period.

4. The non-volatile memory device of claim 3, wherein an erase speed of the word lines other than the at least some of the plurality of word lines is lower than an erase speed of the at least some of the plurality of word lines.

5. The non-volatile memory device of claim 3, wherein the word lines other than the at least some of the plurality of word lines comprise a word line farthest from the substrate among the plurality of word lines.

6. The non-volatile memory device of claim 1, wherein the row decoder is configured to apply a first voltage to a first word line among word lines other than the at least some of the plurality of word lines as the second bias voltage and apply a second voltage different from the first voltage to a second word line among the other word lines other than the at least some of the plurality of word lines as the second bias voltage.

7. The non-volatile memory device of claim 6, wherein the row decoder is configured to apply an erase inhibit voltage higher than the second bias voltage to the plurality of word lines after applying the second voltage to the second word line, and wherein a point in time at which the erase inhibit voltage is applied to the first word line is different from a point in time at which the erase inhibit voltage is applied to the second word line.

8. The non-volatile memory device of claim 1, wherein the row decoder is configured to apply the second bias voltage to the lines other than the at least some of the plurality of word lines in the second period.

9. The non-volatile memory device of claim 1, wherein the row decoder is configured to apply the second bias voltage to the at least some of the plurality of word lines after a predetermined time from a first point in time at which the erase voltage reaches the target level in the second period.

10. The non-volatile memory device of claim 1, wherein the second end of the erase control transistor is connected to at least one of bit lines and a common source line.

11. A non-volatile memory device comprising:

a memory cell array including a plurality of cell strings extending on a substrate in a vertical direction, each of the plurality of cell strings comprising:

a first end and a second end;

a plurality of memory cells connected in series between a third end and a fourth end, and respectively connected to a plurality of word lines divided into a first word line group and a second word line group;

a string selection transistor having a first end and a second end connected to the third end;

a ground selection transistor having a first end and a second end connected to the fourth end; and an erase control transistor having a first end connected to at least one of the first ends of the string selection transistor and the ground selection transistor and a second end connected to at least one of the first end and the second end of each of the plurality of cell strings; and a row decoder configured to apply a first bias voltage to the plurality of word lines in a first period in which an erase voltage applied to the second end of the erase control transistor increases to a first target level and to apply a second bias voltage higher than the first bias voltage to the second word line group in a second period after the first period, during an erase operation for the memory cell array.

12. The non-volatile memory device of claim 11, wherein a distance between the substrate and the second word line group is less than a distance between the substrate and the first word line group.

13. The non-volatile memory device of claim 11, wherein an erase speed of the second word line group is higher than an erase speed of the first word line group.

14. The non-volatile memory device of claim 11, wherein the row decoder is configured to apply a first voltage to a first word line of the second word line group as the second bias voltage and apply a second voltage different from the first voltage to a second word line of the second word line group as the second bias voltage.

15. The non-volatile memory device of claim 11, wherein the row decoder is configured to increase an erase control voltage applied to the erase control transistor to a second target level lower than the first target level in the first period.

16. An erase method of a non-volatile memory device including a plurality of cell strings stacked on a substrate in a vertical direction, each of the plurality of cell strings including a first end and a second end, and a string selection transistor, a plurality of memory cells, a ground selection transistor, and an erase control transistor connected in series between the first end and the second end, the erase method comprising:

increasing a voltage applied to one end of the erase control transistor connected to at least one of the first end and the second end of each of the plurality of cell strings to a level of an erase voltage in a first period of an erase operation period;

applying a first bias voltage to a plurality of word lines connected to the plurality of memory cells in the first period; and applying a second bias voltage higher than the first bias voltage to at least some of the plurality of word lines in a second period after the first period.

17. The erase method of claim 16, further comprising:

applying the second bias voltage to the other word lines other than the at least some of the plurality of word lines in the second period.

18. The erase method of claim 16, further comprising:

applying the first bias voltage to the other-word lines other than the at least some of the plurality of word lines in the second period.

19. The erase method of claim 16, wherein the applying of the second bias voltage comprises:

applying a first voltage to a first group of word lines of the at least some of the plurality of word lines as the second bias voltage in the second period, and applying a second voltage different from the first voltage to a second group of word lines of the at least some of the plurality of word lines as the second bias voltage in the second period.

20. The erase method of claim 16, further comprising:

applying an erase inhibit voltage to the plurality of word lines after applying the second bias voltage to the at least some of the plurality of word lines.

\* \* \* \* \*